(12) United States Patent
Okuyama et al.

(10) Patent No.: US 8,941,296 B2
(45) Date of Patent: Jan. 27, 2015

(54) ORGANIC EL DEVICE HAVING A HIGH LIGHT OUTPUT

(75) Inventors: Suguru Okuyama, Kyoto (JP);
Noriyuki Shimoji, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 77 days.

(21) Appl. No.: 13/439,574

(22) Filed: Apr. 4, 2012

(65) Prior Publication Data
US 2012/0248970 A1 Oct. 4, 2012

(30) Foreign Application Priority Data

Apr. 4, 2011 (JP) .................................. 2011-083012
Feb. 21, 2012 (JP) .................................. 2012-034706

(51) Int. Cl.
| | | |
|---|---|---|
| H05B 33/14 | (2006.01) | |
| H01L 51/52 | (2006.01) | |
| G02B 5/04 | (2006.01) | |
| G02B 3/00 | (2006.01) | |

(52) U.S. Cl.
CPC ........ *H01L 51/5268* (2013.01); *H01L 51/5275* (2013.01); *G02B 5/04* (2013.01); *G02B 3/0056* (2013.01)
USPC .......................................... 313/504; 313/512

(58) Field of Classification Search
CPC ..... H01L 51/5275; G02B 3/0056; G02B 5/04
USPC .......................... 313/504, 506, 512
See application file for complete search history.

(56) References Cited

U.S. PATENT DOCUMENTS

| | | | | |
|---|---|---|---|---|
| 6,960,872 | B2* | 11/2005 | Beeson et al. ................ | 313/113 |
| 2003/0122480 | A1* | 7/2003 | Wei et al. ...................... | 313/506 |
| 2004/0027062 | A1* | 2/2004 | Shiang et al. ................. | 313/506 |
| 2005/0067953 | A1* | 3/2005 | Yamazaki et al. ............ | 313/506 |
| 2005/0212005 | A1* | 9/2005 | Misra et al. ..................... | 257/98 |
| 2005/0231085 | A1* | 10/2005 | Song et al. ..................... | 313/110 |
| 2006/0006795 | A1* | 1/2006 | Strip ............................. | 313/504 |
| 2007/0182318 | A1* | 8/2007 | Kumaki et al. ............... | 313/506 |
| 2007/0284999 | A1* | 12/2007 | Hsieh et al. ................... | 313/498 |
| 2008/0100540 | A1* | 5/2008 | Li et al. ........................... | 345/76 |
| 2009/0026933 | A1* | 1/2009 | Roberts et al. ............... | 313/504 |
| 2012/0043881 | A1* | 2/2012 | Kuroda et al. ................ | 313/504 |

FOREIGN PATENT DOCUMENTS

| | | | |
|---|---|---|---|
| JP | 2002-260845 | A | 9/2002 |
| JP | 2003-045676 | A | 2/2003 |
| JP | 2009/009861 | A | 1/2009 |
| WO | WO-2010/010634 | A1 | 1/2010 |
| WO | WO 2010098480 | A1 * | 9/2010 |

* cited by examiner

*Primary Examiner* — Anh Mai
*Assistant Examiner* — Steven Horikoshi
(74) *Attorney, Agent, or Firm* — Rabin & Berdo, P.C.

(57) ABSTRACT

An organic EL device includes a substrate, a first electrode layer formed on the substrate, an organic EL layer formed on the first electrode layer, and a second electrode layer formed on the organic EL layer. A distribution characteristic of light emitted from the first electrode layer into the substrate has a luminance in a direction of a first angle of 20 to 50 degrees measured with respect to an axis perpendicular to the substrate that is relatively high as compared to luminance in other angular directions.

28 Claims, 42 Drawing Sheets

ORGANIC EL DEVICE HAVING A HIGH LIGHT OUTPUT

CROSS-REFERENCE TO RELATED APPLICATIONS

This application is based upon and claims the benefit of priority from Japanese Patent Application Nos. 2011-83012, filed on Apr. 4, 2011 and 2012-34706, filed on Feb. 21, 2012, the entire contents of which are incorporated herein by reference.

TECHNICAL FIELD

The present disclosure relates to an organic EL (electroluminescence) device, and more particularly, an organic EL device in which light distribution is controlled.

BACKGROUND

In recent years, a display apparatus or a lighting apparatus using organic electroluminescence elements as organic light emitting elements have been developed. Such an organic EL element is typically manufactured by sequentially stacking a transparent electrode as an anode, an organic layer, and a metal electrode as a cathode on a transparent supporting substrate such as a glass substrate, a transparent plastic film, etc.

EL emission is made when electrons supplied from the cathode and holes supplied from the anode are recombined in the organic layer by a voltage applied between the transparent electrode and the metal electrode and excitons generated by the recombination transition from an excited state into a ground state. The EL emission light penetrates through the transparent electrode and is extracted from the transparent supporting substrate to the outside.

In recent years, for the purpose of obtaining high luminance, there has been proposed a structure called Multi Photon Emission ("MPE"), in which a plurality of organic EL layers is stacked with charge generating layers interposed therebetween.

If an organic EL device (hereinafter, the term "organic EL Device" is also used interchangeably to refer to an "OLED (Organic Light Emitting Diode)") is used in illumination, such a MPE structure is suitable for improvements in luminance and durability.

In organic EL devices in the related art, conditions on luminance measurement have been set depending on light emitted out of a substrate (for the sake of convenience, referred to front luminance).

In general, though light distribution in the substrate has a forward projecting shape in order to reduce total internal reflection components, this does not necessarily maximize its total amount of light (total light flux).

Therefore, such organic EL devices in the related art have problems with effective extraction of light generated in an organic layer from the substrate.

SUMMARY

The present disclosure provides some embodiments of an organic EL device with a light distribution controlled to improve an efficiency of light extraction.

According to one aspect of the present disclosure, there is provided an organic EL device. The organic EL device includes a substrate, a first electrode layer formed on the substrate, an organic EL layer formed on the first electrode layer, and a second electrode layer formed on the organic EL layer. With this configuration, a distribution characteristic of light emitted from the first electrode layer into the substrate has a luminance in a direction of a first angle of 20 to 50 degrees measured with respect to an axis perpendicular to the substrate that is relatively high as compared to luminance in other angular directions.

According to another aspect of the present disclosure, there is provided an organic EL device. The organic EL device includes a substrate configured to transmit light and a first electrode layer formed on the substrate and configured to transmit light. The organic EL device further includes a plurality of emission units which are stacked on the first electrode layer and includes a hole transfer layer, an electron transfer layer and an organic emission layer interposed therebetween. In addition, a second electrode layer formed on an emission unit disposed on the top in the stack direction in the plurality of emission units; and a charge generating layer interposed between the emission units are provided in the organic EL device. With this configuration, a distribution characteristic of light emitted from the first electrode layer into the substrate has a luminance in a direction of a first angle of 20 to 50 degrees measured with respect to an axis perpendicular to the substrate that is relatively high as compared to luminance in other angular directions in.

According to yet another aspect of the present disclosure, there is provided an organic EL device. The organic EL device includes a substrate configured to transmit light and a first electrode layer formed on the substrate and configured to transmit light. The organic EL device further includes a first emission unit which is stacked on the first electrode layer and includes a first hole transfer layer, a first electron transfer layer and a first organic emission layer interposed therebetween. In addition, a second emission unit which is stacked on the first emission unit and includes a second hole transfer layer, a second electron transfer layer and a second organic emission layer interposed therebetween is provided in the organic EL device. Moreover, a charge generating layer interposed between the first emission unit and the second emission unit. A second electrode layer formed on the second emission unit disposed on the top in the stack direction is also included in the organic EL device. With this configuration, a distribution characteristic of light emitted from the first electrode layer into the substrate has a luminance in a direction of a first angle of 20 to 50 degrees measured with respect to an axis perpendicular to the substrate that is relatively high as compared to luminance in other angular directions.

According to still another aspect of the present disclosure, there is provided an organic EL device including a substrate; a first electrode layer formed on the substrate, an organic EL layer formed on the first electrode layer; and a second electrode layer formed on the organic EL layer, With this configuration, a distribution characteristic of light emitted from the second electrode layer has a luminance in a direction of a second angle of 20 to 50 degrees measured with respect to an axis perpendicular to the second electrode layer that is relatively high as compared to luminance in other angular directions.

According to still another of the present disclosure, there is provided an organic EL device. The organic EL device includes a substrate and a first electrode layer formed on the substrate. The organic EL device further includes a plurality of emission units which are stacked on the first electrode layer and includes a hole transfer layer, an electron transfer layer and an organic emission layer interposed therebetween. In addition, a second electrode layer formed on an emission unit disposed on the top in the stack direction in the plurality of emission units, and a charge generating layer interposed between the emission units are provided in the organic EL device. With this configuration, a distribution characteristic of light emitted from the second electrode layer has a luminance in a direction of an angle of 20 to 50 degrees measured with respect to an axis perpendicular to the second electrode layer that is relatively high as compared to luminance in other angular directions.

According to still another aspect of the present disclosure, there is provided an organic EL device. The organic EL device includes a substrate and a first electrode layer formed on the substrate. In addition, a first emission unit which is stacked on the first electrode layer and includes a first hole transfer layer, a first electron transfer layer a first organic emission layer interposed therebetween, and a second emission unit which is stacked on the first emission unit and includes a second hole transfer layer, a second electron transfer layer and a second organic emission layer are provided in the organic EL device. Moreover, the organic EL device includes a charge generating layer interposed between the first emission unit and the second emission unit, and a second electrode layer formed on the second emission unit disposed on the top in the stack direction. With this configuration, a distribution characteristic of light emitted from the second electrode layer has a luminance in a direction of a second angle of 20 to 50 degrees measured with respect to an axis perpendicular to the second electrode layer that is relatively high as compared to luminance in other angular directions.

According to still another aspect of the present disclosure, there is provided an organic EL device. The organic EL device includes a substrate configured to transmit light and a first electrode layer formed on the substrate. The organic EL device further includes an organic EL layer formed on the first electrode layer; and a second electrode layer formed on the organic EL layer. With this configuration, a distribution characteristic of light emitted from the first electrode layer into the substrate and a distribution characteristic of light emitted from the second electrode layer have a luminance in a direction of a first angle of 20 to 50 degrees measured with respect to an axis perpendicular to the substrate that is relatively high as compared to luminance in other angular directions and a luminance in a direction of a second angle of 20 to 50 degrees measured with respect to an axis perpendicular to the second electrode layer that is relatively high as compared to luminance in other angular directions.

According to still another aspect of the present disclosure, there is provided an organic EL device. The organic EL device includes a substrate configure to transmit light and a first electrode layer configured to transmit light and is formed on the substrate. The organic EL device further includes a plurality of emission units which are stacked on the first electrode layer and includes a hole transfer layer, an electron transfer layer and an organic emission layer interposed therebetween. In addition, a second electrode layer formed on an emission unit disposed on the top in the stack direction in the plurality of emission units, and a charge generating layer interposed between the emission units are provided in the organic EL device. With this configuration, a distribution characteristic of light emitted from the first electrode layer into the substrate and a distribution characteristic of light emitted from the second electrode layer have a luminance in a direction of a first angle of 20 to 50 degrees measured with respect to an axis perpendicular to the substrate that is relatively high as compared to luminance in other angular directions, and a luminance in a direction of a second angle of 20 to 50 degrees measured with respect to an axis perpendicular to the second electrode layer that is relatively high as compared to luminance in other angular directions.

According to still another aspect of the present disclosure, there is provided an organic EL device. The organic EL device includes a substrate configure to transmit light and a first electrode layer configure to transmit light and is formed on the substrate. The organic EL device further includes a first emission unit which is stacked on the first electrode layer and includes a first hole transfer layer, a first electron transfer layer and a first organic emission layer interposed therebetween, and a second emission unit which is stacked on the first emission unit and includes a second hole transfer layer, a second electron transfer layer and a second organic emission layer interposed therebetween. In addition, a charge generating layer interposed between the first emission unit and the second emission unit, and a second electrode layer formed on the second emission unit disposed on the top in the stack direction are provided in the organic EL device. With this configuration, a distribution characteristic of light emitted from the first electrode layer into the substrate and a distribution characteristic of light emitted from the second electrode layer have a luminance in a direction of a first angle of 20 to 50 degrees measured with respect to an axis perpendicular to the substrate that is relatively high as compared to luminance in other angular directions, and a luminance in a direction of a second angle of 20 to 50 degrees measured with respect to an axis perpendicular to the second electrode layer that is relatively high as compared to luminance in other angular directions.

DETAILED DESCRIPTION

Figure 1A:
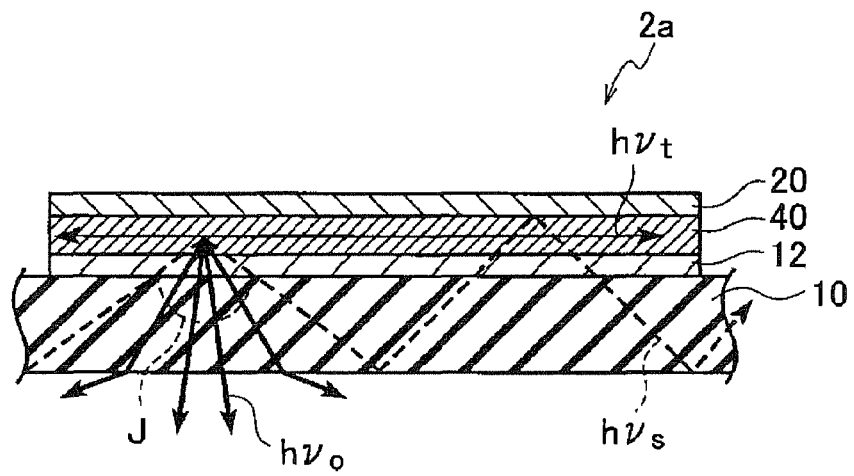
FIG. 1A is a schematic sectional view of an organic EL device according to a comparative example and FIG. 1B is a schematic sectional view illustrating one example of a light distribution characteristic of a light distribution in a substrate shown in FIG. 1A.

Embodiments of the present disclosure will now be described in detail with reference to the drawings. Throughout the drawings, same or similar elements are denoted by same or similar reference numerals. It should be, however, noted that figures are mere schematics, and relationships between thickness and planar dimension of elements, ratios of thicknesses of various layers, and so on may vary without departing from the spirit and scope of the present disclosure. Therefore, details of thicknesses and dimensions of elements should be determined in consideration of the following description. In addition, it should be understood that the figures may include different dimensional relationships and scales.

In the following detailed description, numerous specific details are set forth in order to provide a thorough understanding of the present disclosure(s). However, it will be apparent to one of ordinary skill in the art that the present disclosure(s) may be practiced without these specific details. In other instances, well-known methods, procedures, systems, and components have not been described in detail so as not to unnecessarily obscure aspects of the present disclosure.

In addition, the following embodiments are provided to illustrate devices and methods to embody the technical ideas of the present disclosure and are not intended to limit material, shape, structure, arrangement and so on of elements to those recited in the disclosed embodiments of the present disclosure. The disclosed embodiments may be modified in various ways without departing from the spirit and scope of the present disclosure set forth in the claims.

COMPARATIVE EXAMPLE

As shown in FIG. 1A, an organic EL device 2a according to a comparative example includes a substrate 10, a first electrode layer 12 formed on the substrate 10, an organic EL layer 40 formed on the first electrode layer 12, and a second electrode layer 20 formed on the organic EL layer 40. In this example, the substrate 10 is assumed as a glass substrate having a refractive index of about 1.5.

Figure 1B:
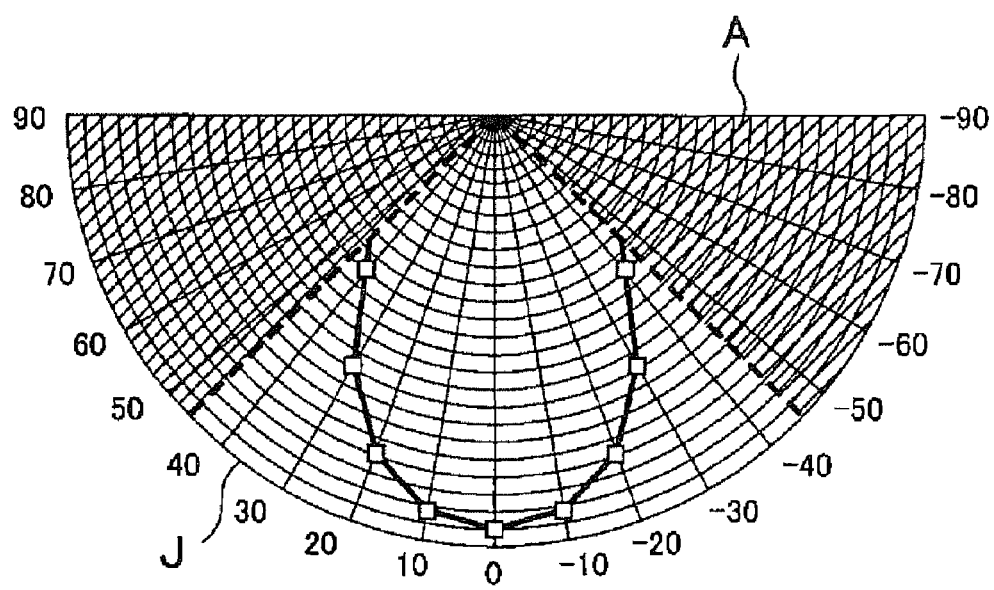

For example, light in the EL device 2a according to the comparative example includes film mode light $hv_t$ of about 50%, substrate mode light $hv_s$ of about 30% and external extraction light $hv_o$ of about 20%, as indicated by arrow in FIG. 1A. In addition, as shown in FIG. 1B, light in a region A beyond about 45 degrees is typically totally reflected at a substrate-air interface. Accordingly, as shown in FIG. 1B, a light distribution characteristic in the substrate has a forward projecting shape in order to reduce total internal reflection components. Accordingly, the light distribution characteristic of the organic EL device 2a according to the comparative example is not necessarily maximized in its total amount of light (total light flux).

<First Embodiment>

Figure 2:
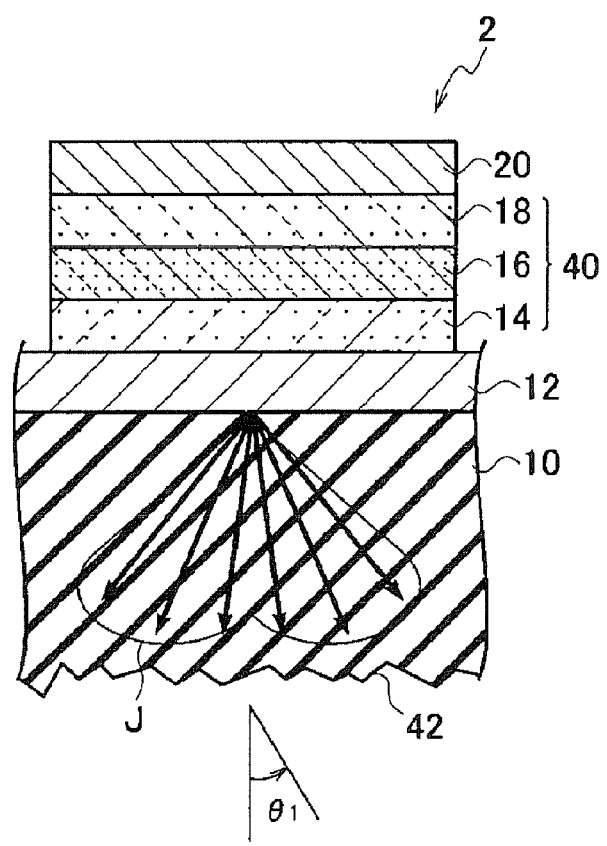
FIG. 2 is a schematic sectional view of an organic EL device according to a first embodiment.

As shown in FIG. 2, an organic EL device 2 according to a first embodiment includes a substrate 10, a first electrode layer 12 formed on the substrate 10, an organic EL layer 40 formed on the first electrode layer 12, and a second electrode layer 20 formed on the organic EL layer 40. In this embodiment, a characteristic of a light distribution J in the substrate has a luminance in a direction of a first angle $\theta_1$ of 20 to 50 degrees measured with respect to an axis perpendicular to the substrate 10 that is relatively high as compared to luminance in other angular directions. Accordingly, the characteristic of the light distribution J in the substrate in the organic EL device 2 according to the first embodiment is maximized in its total amount of light (total light flux).

In this embodiment, the organic EL layer 40 includes a hole transfer layer (HTL) 14 formed on the first electrode layer 12, an organic emission layer (EML) 16 formed on the hole transfer layer 14, and an electron transfer layer (ETL) 18 formed on the organic emission layer 16.

The substrate 10 is a transparent substrate which transmits light, such as a glass substrate, a plastic film attached with a gas barrier, etc. The substrate 10 has thickness of, for example, about 0.1 mm to 1.1 mm. In addition, the substrate 10 may be provided with flexibility using a transparent resin such as polycarbonate, polyethylene terephthalate (PET), etc.

The first electrode layer 12 may be formed of a transparent electrode of indium tin oxide (ITO) having thickness of, for example, about 50 nm to 500 nm. In addition, the first electrode layer 12 may be formed of indium zinc oxide (IZO), antimony tin oxide (ATO) or PEDOTT-PSS. In addition, the first electrode layer 12 may be a translucent electrode film made of a metal such as Ag, etc.

In the organic EL layer 40, for example, the hole transfer layer 14, the organic emission layer 16 and the electron transfer layer 18 are stacked in order. In this embodiment, in the organic EL layer 40, the organic emission layer 16 is interposed between the hole transfer layer 14 and the electron transfer layer 18 in the stack order of, for example, the hole transfer layer 14, the organic emission layer 16 and the electron transfer layer 18 or in the stack order of the electron transfer layer 18, the organic emission layer 16 and the hole transfer layer 14 in the direction from the first electrode layer 12 to the second electrode layer 20. In other words, the stack order may be properly selected depending on a polarity of a bias voltage applied between the first electrode layer 12 and the second electrode layer 20.

The hole transfer layer 14 is a layer used to transfer holes injected from the first electrode layer 12 into the organic emission layer 16 smoothly and may be made of, for example, 4,4'-bis[N-(1-naphthyl-1-)N-phenyl-amino]-biphenyl, etc.

The organic emission layer 16 is a layer used to emit light by recombination of electrons and the injected holes and may be made of aluminum(8-hydroxy)quinolinate doped with dopants such as rubrene, chelate compounds which contain transition metal atoms, etc.

Some of the organic emission layer 16 may be made of $Alq_3$ which is doped by about 1% with blue emission species (for example DPVBi (4,4'-bis(2,2'-diphenylvinyl)-1,1'-biphenyl) and has a thickness of about 30 nm to 50 nm.

Alternatively, some of the organic emission layer 16 may be made of $Alq_3$ which is doped by about 1% with green emission species (for example dimethylquinacridone) and has a thickness of about 30 nm to 50 nm.

As another alternative, some of the organic emission layer 16 may be made of $Alq_3$ which is doped by about 1% with red emission species (for example nile red) and has a thickness of about 30 nm to 50 nm.

The electron transfer layer 18 is a layer used to transfer electrons injected from the second electrode layer 20 into the organic emission layer 16 smoothly and may be made of, for example, aluminum(8-hydroxy)quinolinate.

In addition to the hole transfer layer 14 and the electron transfer layer 18, the organic EL layer 40 may include, for example, a hole injection layer (HIL) adjacent to the hole transfer layer 14, an electron injection layer (EIL) adjacent to the electron transfer layer 18, and so on.

The second electron layer 20 may be formed of a film made of, for example, Al, Ag, etc having a high reflectivity.

The organic EL device 2 according to the first embodiment has a bottom emission structure in which the substrate 10 is formed of a transparent substrate having an emission surface and the second electrode layer 20 is formed of a metal layer, as shown in FIG. 1.

In the organic EL device 2 according to the first embodiment, when bottom emission light is obliquely output from a surface of the first electrode layer 12, the total amount of light (total light flux) of the light distribution J injected into the substrate 10 can be increased.

In addition, in the organic EL device 2 according to the first embodiment, the substrate 10 may have a randomly uneven surface 42 formed on a rear surface in the opposite side to a front surface on which the first electrode layer 12 is formed, as shown in FIG. 2. In this manner, by forming the randomly uneven surface 42 on the emission surface of the substrate 10, it is possible to extract light with the first angle $\theta_1$ measured with respect to an axis perpendicular to the substrate 10 larger than light with the total internal refection angle. That is, by providing unevenness for the emission surface of the substrate 10, original light components of total reflection can be also extracted out of the substrate 10, thereby improving final emission efficiency.

<First Modification>

Figure 3:
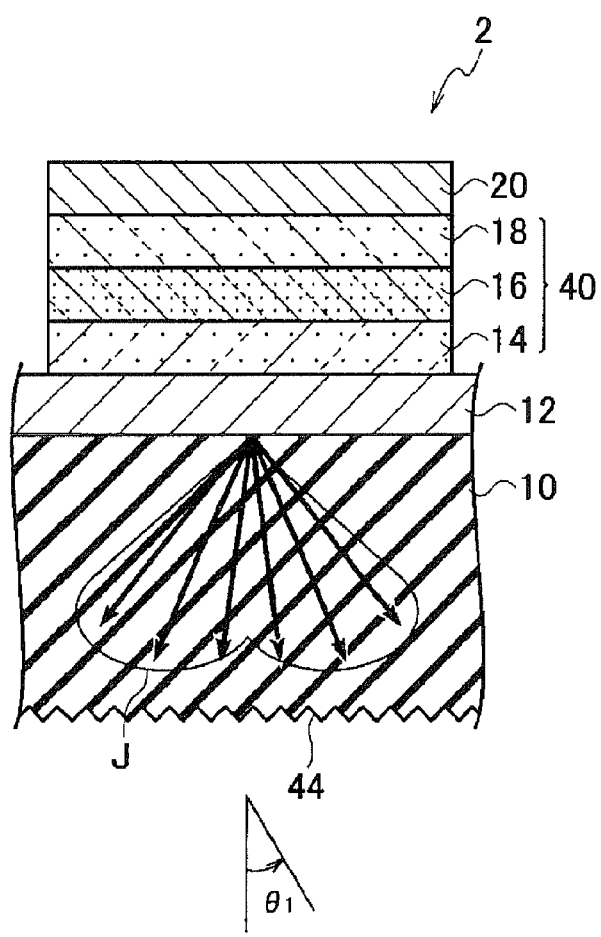
FIG. 3 is a schematic sectional view of an organic EL device according to a first modification of the first embodiment.

As shown in FIG. 3, an organic EL device 2 according to a first modification of the first embodiment has an uneven surface 44. The uneven surface 44 is patterned into a predetermined pattern structure on a rear surface in the opposite side to a front surface on which the first electrode layer 12 of the substrate 10 is formed.

In this modification, examples of the predetermined pattern structure may include a circular pattern, a triangle-based circular pattern, a square pattern, a rectangular pattern and the like.

In the organic EL device 2 according to the first modification of the first embodiment, by providing the uneven surface 44 patterned into the predetermined pattern structure, it is possible to extract light with the first angle $\theta_1$ measured with respect to an axis perpendicular to the substrate 10 larger than light with the total internal refection angle.

Also in the organic EL device 2 according to the first modification of the first embodiment, a characteristic of a light distribution J in the substrate has a luminance in a direction of a first angle $\theta_1$ of 20 to 50 degrees measured with respect to an axis perpendicular to the substrate 10 that is relatively high as compared to luminance in other angular directions. Accordingly, the characteristic of the light distribution J in the substrate in the organic EL device 2 according to the first modification of the first embodiment is maximized in its total amount of light (total light flux). Other configurations in this modification are the same as those in the first embodiment and therefore, explanations of which will not be repeated.

<Second Modification>

Figure 4:
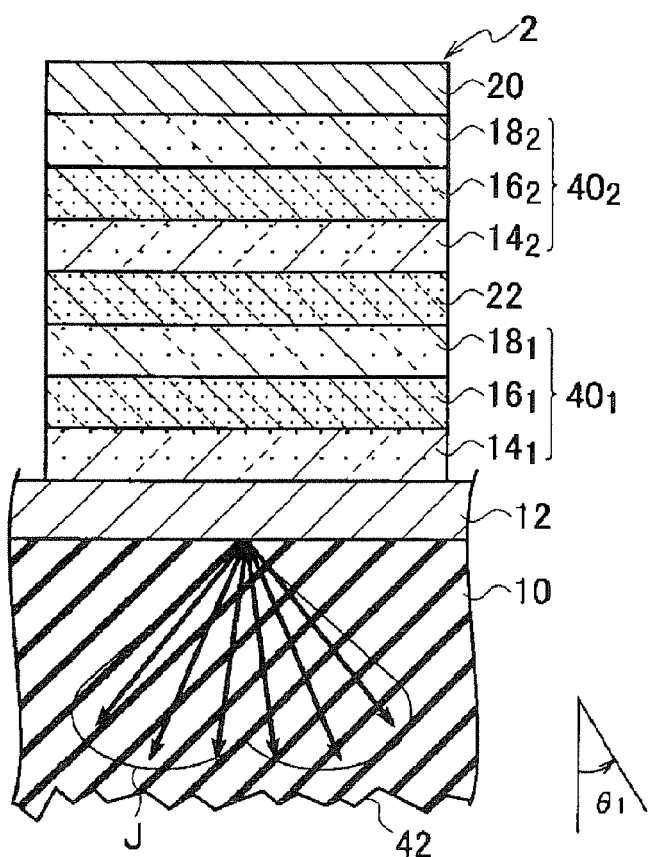
FIG. 4 is a schematic sectional view of an organic EL device according to a second modification of the first embodiment.

As shown in FIG. 4, an organic EL device 2 according to a second modification of the first embodiment has a MPE (Multiphoton Emission) type structure including one or more charge generating layers and a plurality of emission units containing two or more organic emission layers.

As shown in FIG. 4, the organic EL device 2 according to the second modification of the first embodiment generally includes a substrate 10 and a first electrode layer 12 formed on the substrate 10, which transmits light. The organic EL device 2 further includes a plurality of emission units $40_1$ and $40_2$ (and $40_3$ or more if applicable) which is stacked on the first electrode layer 12 and includes hole transfer layers $14_1$ and $14_2$ (and $14_3$ or more if applicable), electron transfer layers $18_1$ and $18_2$ (and $18_3$ or more if applicable) and organic emission layers $16_1$ and $16_2$ (and $16_3$ or more if applicable) interposed therebetween. In addition, a second electrode layer 20 is formed on the emission unit $40_2$ and is disposed on the top in the stack direction in the plurality of emission units $40_1$ and $40_2$. The charge generating layer 22 (which may include a plurality of layers $22_1, 22_2, \ldots, 22_n$) is interposed between the emission units. In this modification, a distribution characteristic of light emitted from the first electrode layer 12 into the substrate 10 has a luminance in a direction of a first angle $\theta_1$ of 20 to 50 degrees measured with respect to an axis perpendicular to the substrate 10 that is relatively high as compared to luminance in other angular directions.

In this modification, the plurality of plurality of emission units $40_1$ and $40_2$ includes the hole transfer layers $14_1$ and $14_2$, the electron transfer layers $18_1$ and $18_2$, and the organic emission layers $16_1$ and $16_2$ interposed therebetween. They are stacked, for example, in the stack order of the hole transfer layers $14_1$ and $14_2$, the organic emission layers $16_1$ and $16_2$, and the electron transfer layers $18_1$ and $18_2$, or in the stack order of the electron transfer layers $18_1$ and $18_2$, the organic emission layers $16_1$ and $16_2$, and the hole transfer layers $14_1$ and $14_2$, in the direction from the first electrode layer 12 to the second electrode layer 20. In other words, the stack order may be properly selected depending on a polarity of a bias voltage applied between the first electrode layer 12 and the second electrode layer 20.

Specifically, as shown in FIG. 4, the organic EL device 2 according to the second modification of the first embodiment includes the substrate 10 and the first electrode layer 12 formed on the substrate 10, which transmit light. The organic EL device 2 further includes the first emission unit $40_1$, which is stacked on the first electrode layer 12 and includes the first hole transfer layer $14_1$, the first electron transfer layer $18_1$ and the first organic emission layers $16_1$ interposed therebetween in the direction from the first electrode layer 12 to the second electrode layer 20. In addition, the second emission unit $40_2$ includes the second hole transfer layer $14_2$, the second electron transfer layer $18_2$, and the second organic emission layers $16_2$ interposed therebetween in the direction from the first electrode layer 12 to the second electrode layer 20. Moreover, the organic EL device 2 includes the charge generating layer 22 interposed between the first emission unit $40_1$ and the second emission unit $40_2$, and the second electrode layer 20 formed on the emission unit $40_2$. The second electrode layer 20 is placed on the top in the stack direction. In this modification, a characteristic of a light distribution J in the substrate has a luminance in a direction of a first angle $\theta_1$ of 20 to 50 degrees measured with respect to an axis perpendicular to the substrate 10 that is relatively high as compared to luminance in other angular directions. Accordingly, the characteristic of the light distribution J in the organic EL device 2 according to the second modification of the first embodiment is maximized in its total amount of light (total light flux).

The charge generating layer 22 is made of, for example, an organic compound, or an inorganic compound composed of metals having a melting point lower than that of aluminum as a simple substance. Resistance of the inorganic compound of which the charge generating layers $22_1$ to $22_{n-1}$ is made is, for example, $1\times10^2$ Ω·cm or more, more specifically $1\times10^5$ Ω·cm or more.

Examples of the inorganic compound may include an oxide, a chloride, a bromide, an iodide and so on. The melting point of Al is about 660 degrees C. Examples of metals having a melting point lower than that of Al as a simple substance may include gallium (Ga), indium (In), antimony (Sb), zinc (Zn) and so on. Melting points of Ga, In, Sb and Zn are 29.8 degrees C., 156.4 degrees C., 630.7 degrees C. and 419.5 degrees C., respectively.

The charge generating layer 22 may be made of an organic compound. Resistance of the organic compound of which the charge generating layer 22 is made is, for example, $1\times10^2$ Ω·cm or more, more specifically $1\times10^5$ Ω·cm or more.

As shown in FIG. 4, the organic EL device 2 according to the second modification of the first embodiment may have a randomly uneven surface 42. The uneven surface 42 is provided on a rear surface in the opposite side to a front surface on which the first electrode layer 12 of the substrate 10 is formed.

In the organic EL device 2 according to the second modification of the first embodiment, by providing the randomly uneven surface 42 on the emission surface of the substrate 10, it is possible to extract light with the first angle $\theta_1$ measured with respect to an axis perpendicular to the substrate 10 larger than light with the total internal refection angle. Other configurations in this modification are the same as those in the first embodiment.

<Third Modification>

Figure 5:
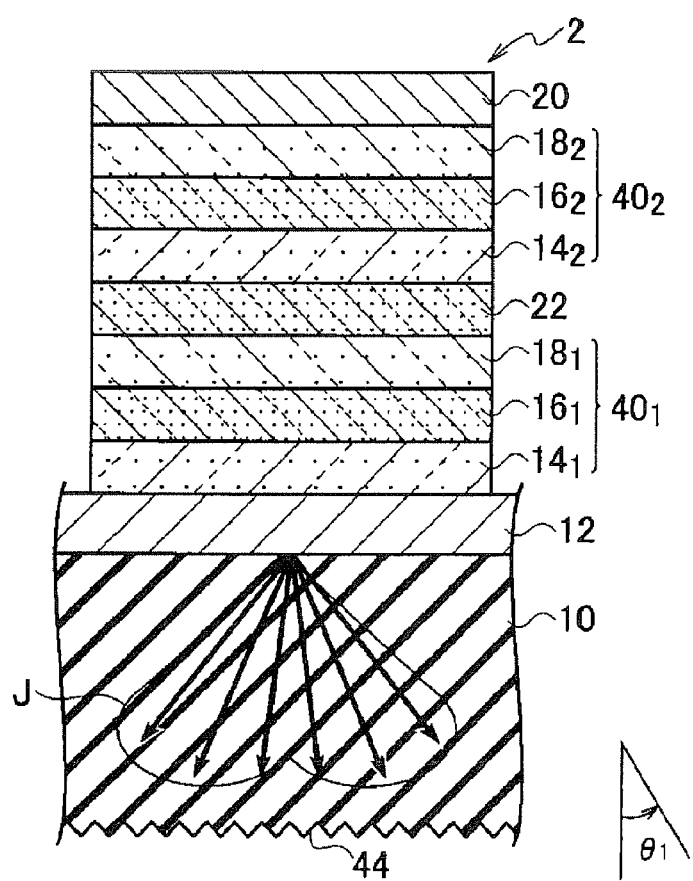
FIG. 5 is a schematic sectional view of an organic EL device according to a third modification of the first embodiment.

As shown in FIG. 5, an organic EL device 2 according to a third modification of the first embodiment has an uneven surface 44 which is patterned into a predetermined pattern structure on a rear surface in the opposite side to a front surface, on which the first electrode layer 12 of the substrate 10 is formed.

In this modification, the predetermined pattern structure may include, for example, a circular pattern, a triangle-based circular pattern, a square pattern, a rectangular pattern and the like.

In the organic EL device 2 according to the third modification of the first embodiment, by forming the uneven surface 44 patterned into the predetermined pattern structure, it is possible to extract light with the first angle $\theta_1$ larger than the total internal refection angle measured with respect to an axis perpendicular to the substrate 10.

The organic EL device 2 according to the third modification of the first embodiment may include a film having randomly uneven portion. The uneven portion is formed on its emission side on the rear surface in the opposite side to the front surface on which the first electrode layer 12 of the substrate 10 is formed.

Also in the organic EL device 2 according to the third modification of the first embodiment, a light distribution J in the substrate has a luminance in a direction of a first angle $\theta_1$ of 20 to 50 degrees measured with respect to an axis perpendicular to the substrate 10 that is relatively high as compared to luminance in other angular directions. Accordingly, the characteristic of the light distribution J in the substrate in the organic EL device 2 according to the third modification of the first embodiment is maximized in its total amount of light (total light flux). Other configurations in this modification are similar as those in the first embodiment, and thus in the interest of brevity, will not repeated.

<Angle Setting Conditions>

Figure 6:
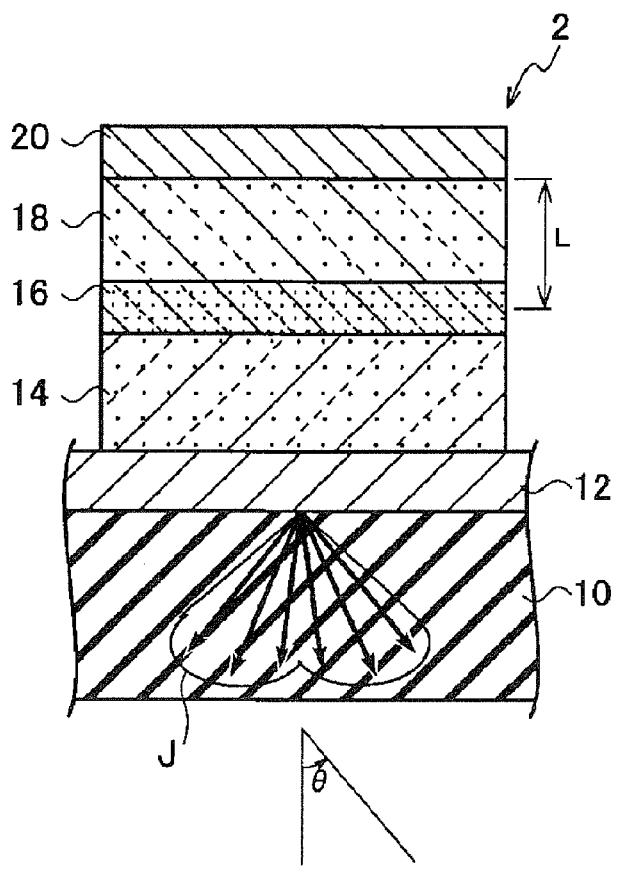
FIG. 6 is a schematic sectional view used to illustrate the principle of operation of the organic EL device according to the first embodiment.

FIG. 6 is a schematic sectional view illustrating the principle of operation of the organic EL device 2 according to the first embodiment. In FIG. 6, if the emission position-cathode (the second electrode layer) distance L is varied while the thickness of the hole transfer layer 14 remains constant, the total amount of light (total light flux) emitted from the first electrode layer 12 to the substrate 10 is also changed. It is assumed in FIG. 6 that an angle θ (degree) from the front direction is measured with respect to an axis perpendicular to the substrate 10 and a direction from the substrate to the air (the external) is set to 0 degree.

Figure 7:
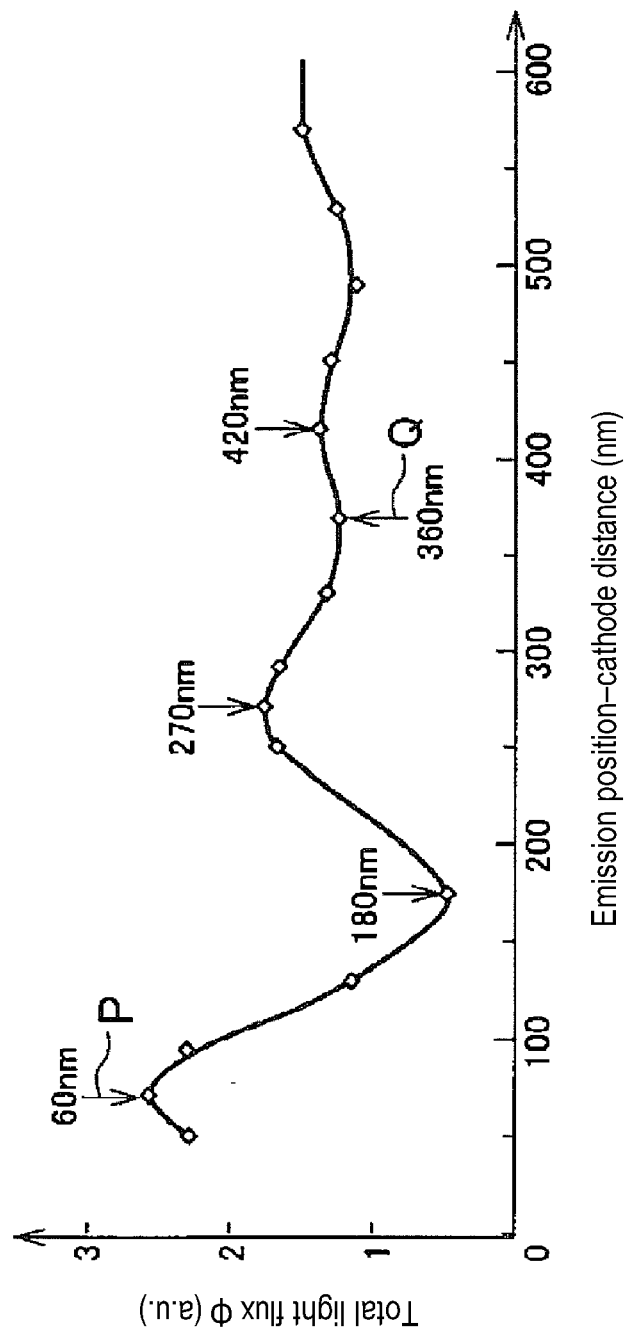
FIG. 7 is a graph illustrating a relationship between total light flux φ and an emission position-cathode distance in the organic EL device according to the first embodiment.

FIG. 7 is a graph illustrating a relationship between the total light flux φ and the emission position-cathode distance L in the organic EL device 2 according to the first embodiment. As can be clearly seen from FIG. 7, peaks P of the total light flux φ are obtained at emission position-cathode distances L of about 60 nm, about 270 nm and about 420 nm. Bottoms Q of the total light flux φ are obtained at emission position-cathode distances L of about 180 nm and about 360 nm.

Figure 8:
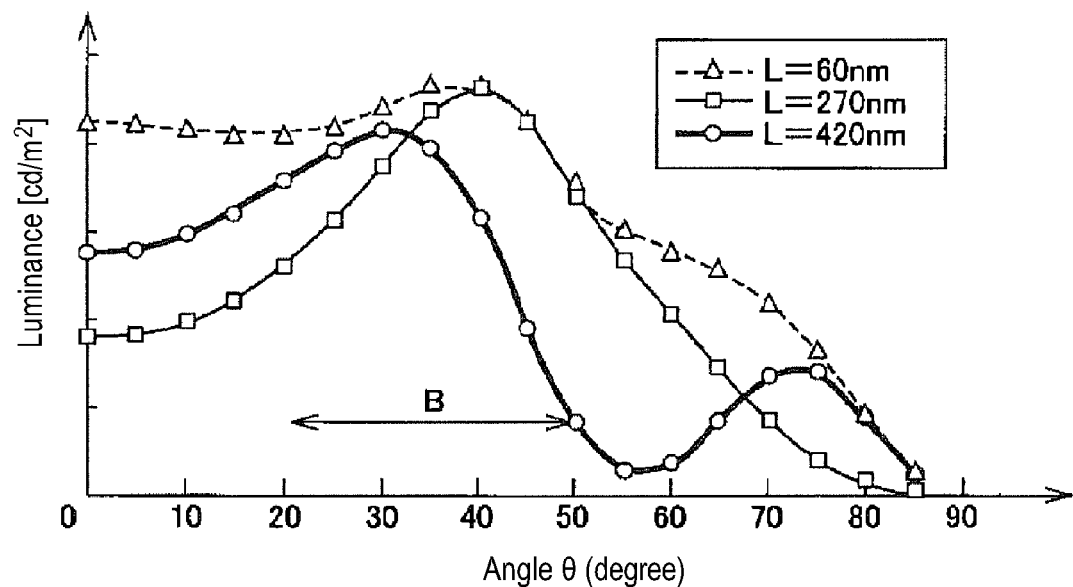
FIG. 8 is a graph illustrating a relationship between luminance (cd/m$^2$) whose parameter is an emission position-cathode distance L for a high total light flux φ and an angle $\theta_1$ (degree) from the front direction in the organic EL device according to the first embodiment.

FIG. 8 is a graph illustrating a relationship between luminance (cd/m²) whose parameter is the emission position-cathode distance L for a high total light flux φ and an angle θ (degree) from the front direction in the organic EL device 2 according to the first embodiment. As can be clearly seen from FIG. 8, peaks of the luminance are obtained within a range (indicated by an arrow B) of angle θ from about 20 degrees to about 50 degrees at emission position-cathode distances L of about 60 nm, about 270 nm and about 420 nm for the high total light flux φ.

Figure 9:
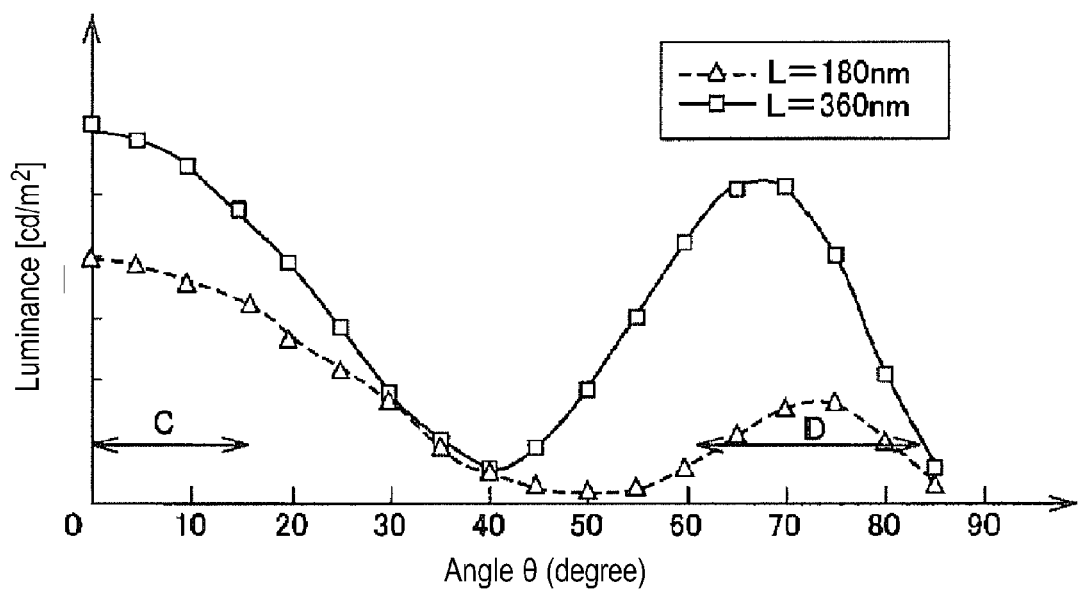
FIG. 9 is a graph illustrating a relationship between luminance (cd/m$^2$) whose parameter is an emission position-cathode distance L for a low total light flux φ and an angle $\theta_1$ (degree) from the front direction in the organic EL device according to the first embodiment.

FIG. 9 is a graph illustrating a relationship between luminance (cd/m²) whose parameter is the emission position-cathode distance L for a low total light flux φ and an angle θ (degree) from the front direction in the organic EL device 2 according to the first embodiment. As can be clearly seen from FIG. 9, peaks of the luminance are obtained within a range (indicated by an arrow C) of angle θ from about 0 degree to about 15 degrees and a range (indicated by an arrow D) of angle θ from about 60 degrees to about 85 degrees at emission position-cathode distances L of about 180 nm and about 360 nm for the low total light flux φ.

<Element Surface Reflectivity Average>

Figure 10:
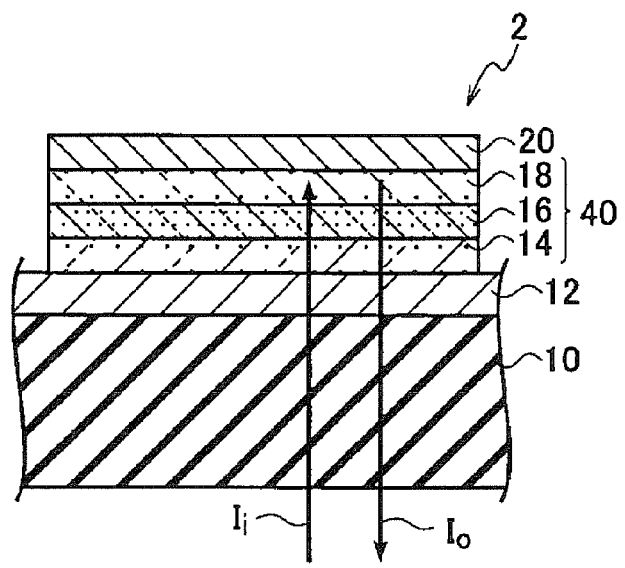
FIG. 10 is a schematic sectional view used to illustrate an element front reflectivity average (reflectance) in the organic EL device according to the first embodiment.

As shown in FIG. 10, an element front reflectivity average (reflectance) in the organic EL device 2 according to the first embodiment is obtained by incidence of incident light $I_i$ from the external (front) and measurement of reflected light $I_o$ under the condition where the substrate has an even surface. Since an emission spectrum range of the organic EL device 2 according to the first embodiment is typically a range of 440 nm to 780 nm, an average of the emission spectrum range is calculated by measuring a dependency of the reflectance on a wavelength λ.

Figure 11:
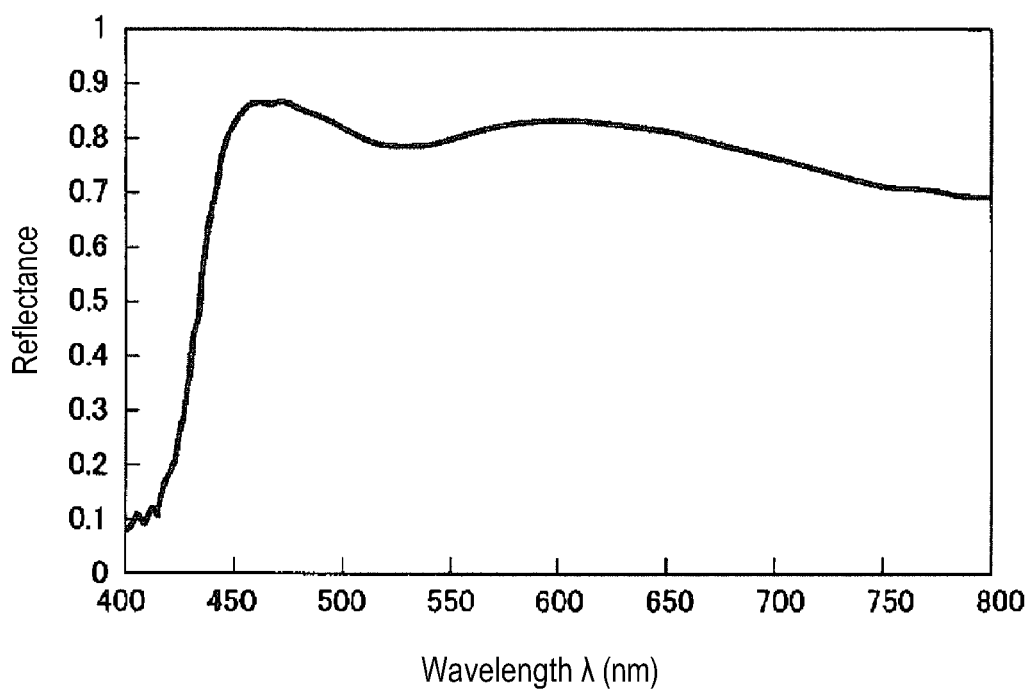
FIG. 11 is a graph illustrating a relationship between a reflectance and a wavelength λ in the organic EL device according to the first embodiment.

FIG. 11 is a graph illustrating a relationship between the reflectance and the wavelength λ in the organic EL device 2 according to the first embodiment. It is illustrated in FIG. 11 that an element surface reflectivity average is about 80%.

<Relationship Between Element Surface Reflectivity Average and Rate of Improvement in Total Light Flux>

Figure 12A:
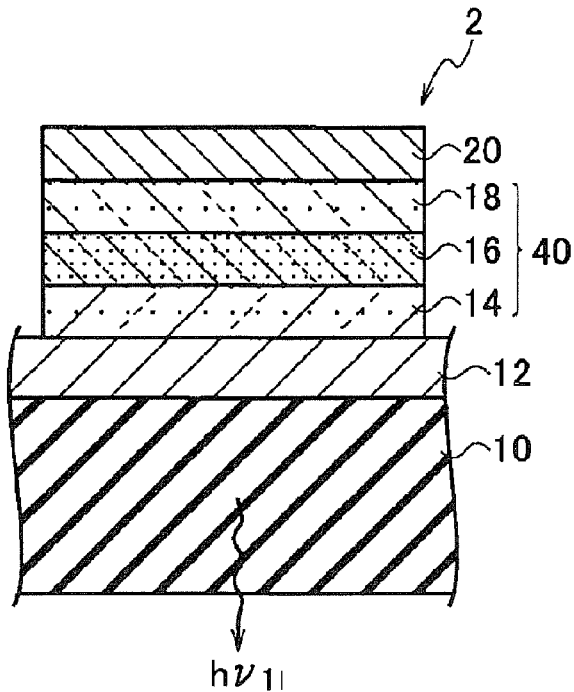
FIGS. 12A and 12B are explanatory views illustrating structures of elements having different reflectivities in the organic EL device according to the first embodiment, FIG. 12A being a schematic sectional view of a structure where an emission surface of a substrate is even and FIG. 12B being a schematic sectional view of a structure including a light extraction film having uneven portion.
Figure 12B:
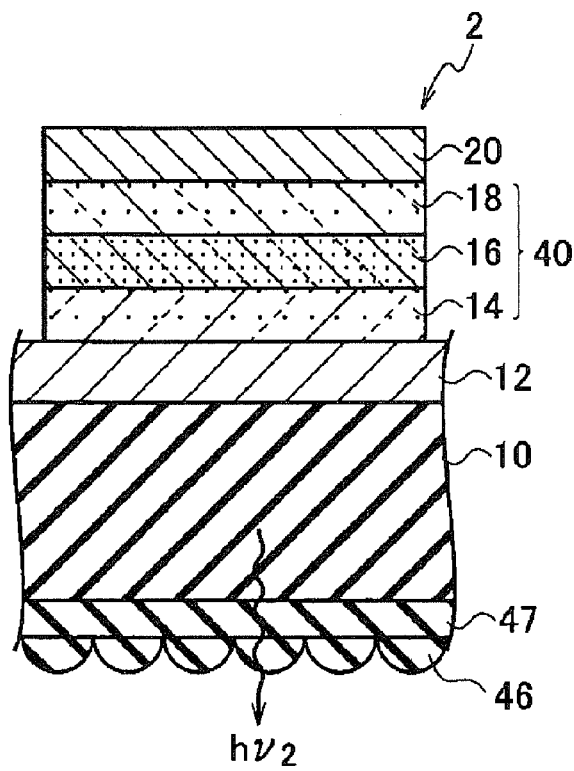

FIGS. 12A and 12B illustrate structures of elements having different reflectivities in the organic EL device 2 according to the first embodiment. FIG. 12A is a schematic sectional view of a structure where the emission surface of the substrate is even, and FIG. 12B is a schematic sectional view of a structure including a light extraction film 47 having uneven portion 46. The total light flux of light $hv_2$ extracted to the external in the structure of FIG. 12B is higher than the total light flux of light $hv_1$ extracted to the external in the structure of FIG. 12A.

Here, a rate of improvement may be calculated by dividing total light flux with light extraction film by total light flux without light extraction film.

Figure 13:
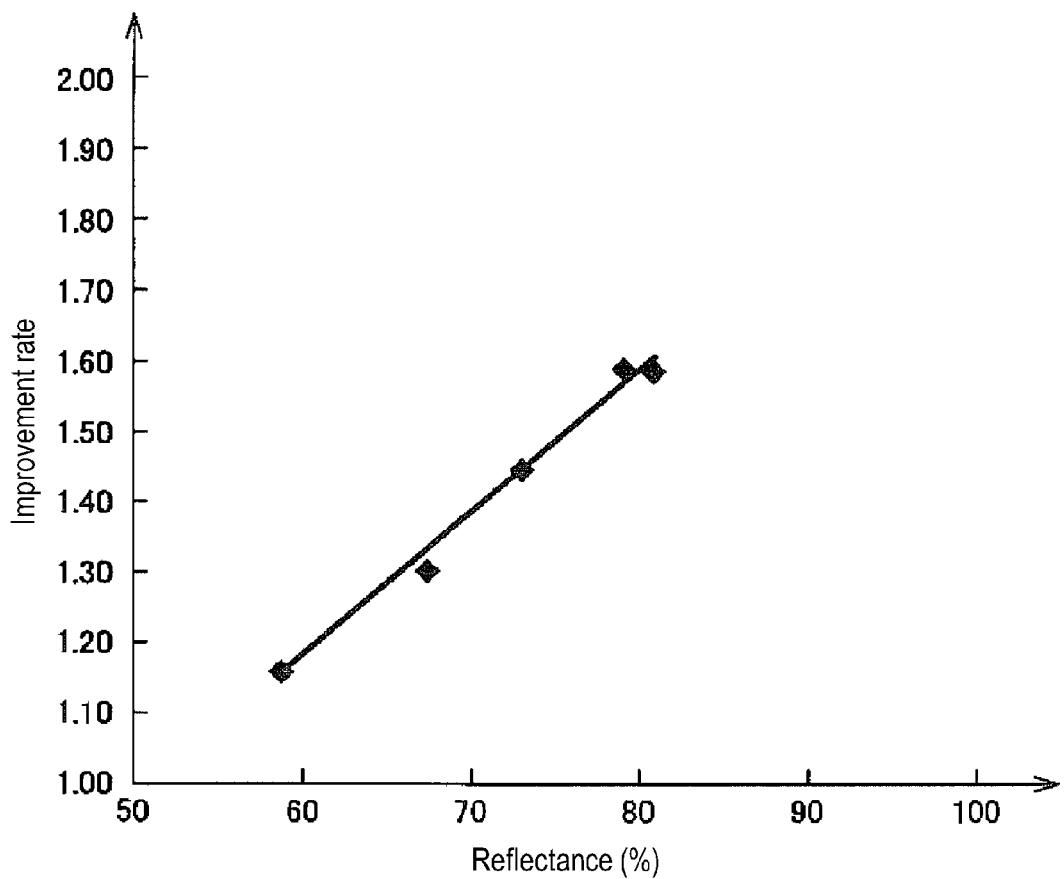
FIG. 13 is a graph illustrating a relationship between rate of improvement by a light extraction film and a reflectance in the organic EL device according to the first embodiment.

FIG. 13 is a graph illustrating a relationship between rate of improvement by the light extraction film 47 and element front reflectivity average (reflectance) in the organic EL device 2 according to the first embodiment. The improvement rate and the reflectance have substantially a linear relationship. For example, improvement rates of about 1.2, 1.4 and 1.6 are obtained for reflectances of 60%, 70% and 80%, respectively.

In the organic EL device 2 according to the first embodiment, the element surface reflectivity average may be 70% or more in order to obtain a sufficient improvement rate.

<Effects of Reflected Light Reflected Repeatedly>

Figure 14:
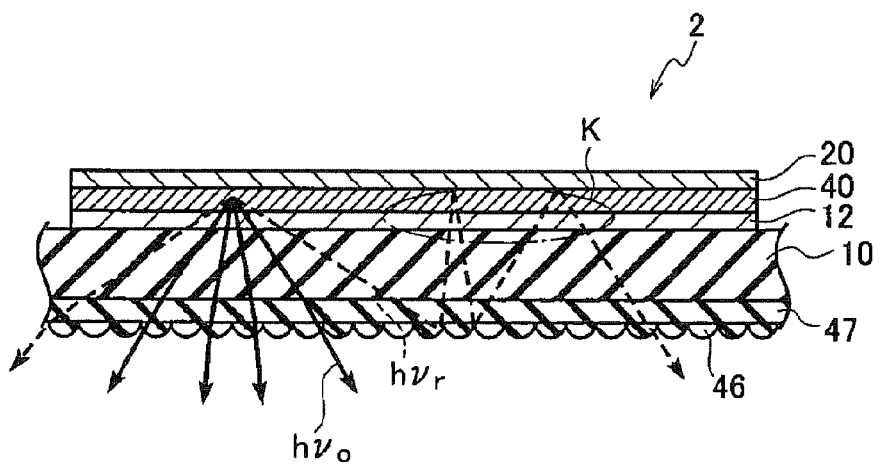
FIG. 14 is a schematic sectional view illustrating effects of reflected light reflected repeatedly when a light extraction film is attached in the organic EL device according to the first embodiment.
Figure 15A:
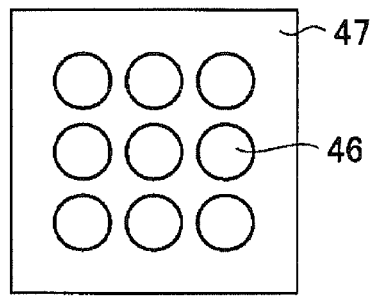
FIGS. 15A to 15D are views illustrating examples of a schematic planar pattern structure of a light extraction film, including a circular pattern in FIG. 15A, a triangle-based circular pattern in FIG. 15B, a square pattern in FIG. 15C and a rectangular pattern in FIG. 15D, respectively, in the organic EL device according to the first embodiment.
Figure 15B:
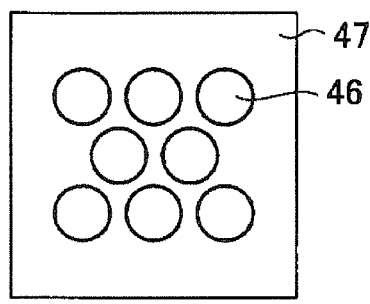
Figure 15C:
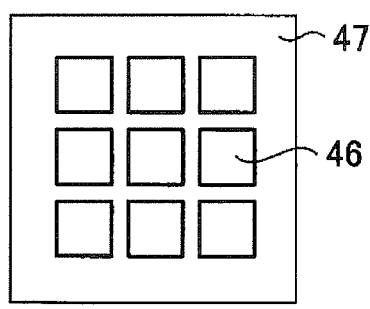
Figure 15D:
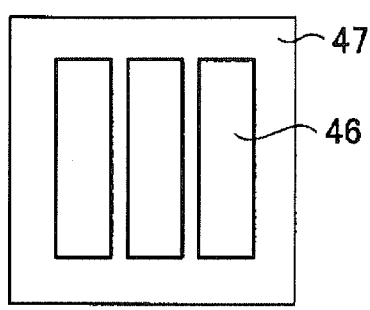
Figure 16A:
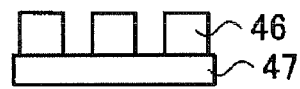
FIGS. 16A to 16D are views illustrating examples of a schematic sectional structure of a light extraction film, including a square structure in FIG. 16A, a trapezoidal structure in FIG. 16B, a triangular structure in FIG. 16C and a semicircular structure in FIG. 16D, respectively, in the organic EL device according to the first embodiment.
Figure 16B:
Figure 16C:
Figure 16D:

FIG. 14 is a schematic sectional view illustrating effects of reflected light reflected repeatedly if the light extraction film 47 having an uneven portion 46 is attached in the organic EL device 2 according to the first embodiment. As shown in FIG. 14, for output light $hv_o$, reflected light $hv_r$ is repeatedly reflected at the light extraction film 47 having the uneven portion 46 and an interface between the organic EL layer 40 and the second electrode layer 20, as denoted by K in FIG. 14. If a light absorptivity in the organic EL device 2 is high and a reflectivity in the second electrode layer 20 is low, intensity of the reflected light reflected repeatedly is gradually lowered.

On the other hand, if the light absorptivity in the organic EL device 2 is relatively low and the reflectivity in the second electrode layer 20 is relatively high, deterioration of the intensity of the light in the interior of the organic EL device 2 and at the interface between the organic EL layer 40 and the second electrode layer 20 is low, thereby providing a high effect of extraction of the light to the external. If the light extraction film 47 having the uneven portion 46 is attached to the emission surface of the substrate 10, the totally reflected light may be easily extracted to the external by freeing from the conditions of total internal reflection during the repetition of reflection. Accordingly, a higher reflectivity provides a higher effect of extraction of light to the external.

As shown in FIGS. 12B and 14, the organic EL device 2 according to the first embodiment may include the light extraction film 47 having the uneven portion 46. The film 47 is patterned into a predetermined pattern structure on its emission side on the rear surface in the opposite side to the front surface on which the first electrode layer 12 of the substrate 10 is formed.

With this configuration, examples of the predetermined pattern structure may include, for example, a circular pattern, a triangle-based circular pattern, a square pattern, a rectangular pattern, etc., as shown in FIGS. 15A to 15D. In addition, the schematic sectional structure of the uneven portion 46 on the light extraction film 47 may include, for example, a square structure, a trapezoidal structure, a triangular structure, a semicircular structure and so on, as shown in FIGS. 16A to 16D. Here, a step difference of the uneven portion 46 in the film thickness direction is, for example, about 0.5 μm to 100 μm, and an unevenness pitch of the uneven portion 46 is, for example, about 0.5 μm to 100 μm. For example, a hemispherical lens array type light extraction film may be used as the light extraction film 47 having the uneven portion 46.

In the organic EL device 2 according to the first embodiment, by providing a film having randomly uneven portion on the emission surface or providing the light extraction film 47 having the uneven portion 46 patterned into the predetermined pattern structure on the emission surface, it is possible to extract light with the angle larger than the total internal refection angle measured with respect to the axis perpendicular to the substrate 10.

<Efficiency of Light Extraction by Control of Light Distribution>

Figure 17A:
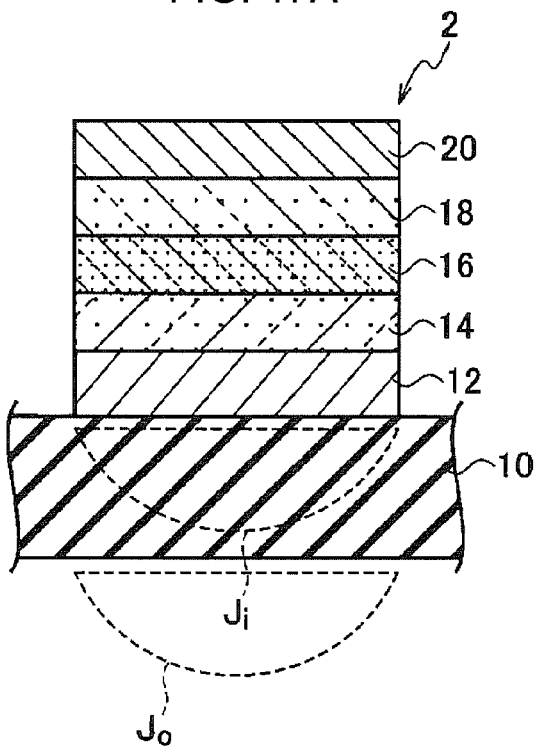
FIG. 17A is a schematic sectional view illustrating a light distribution Ji in a substrate and an external light distribution Jo in a structure where an emission surface of the substrate is even.
Figure 17B:
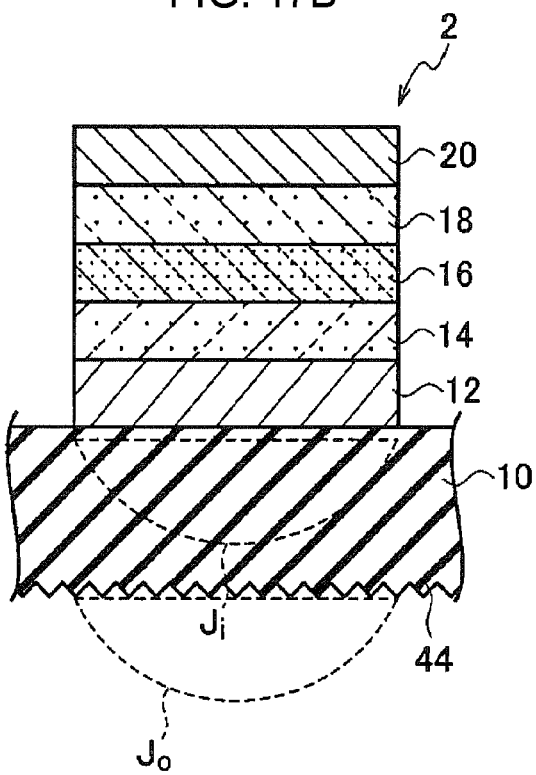
FIG. 17B is a schematic sectional view illustrating a light distribution Ji in a substrate and an external light distribution Jo in a structure where the substrate has uneven emission surface, respectively.

FIG. 17A is a schematic sectional view illustrating a light distribution Ji in the substrate and an external light distribution Jo in a structure where the emission surface of the substrate 10 is even, and FIG. 17B is a schematic sectional view illustrating a light distribution Ji in the substrate and an external light distribution Jo in a structure where the emission surface of the substrate 10 has an uneven surface 44.

Figure 18:
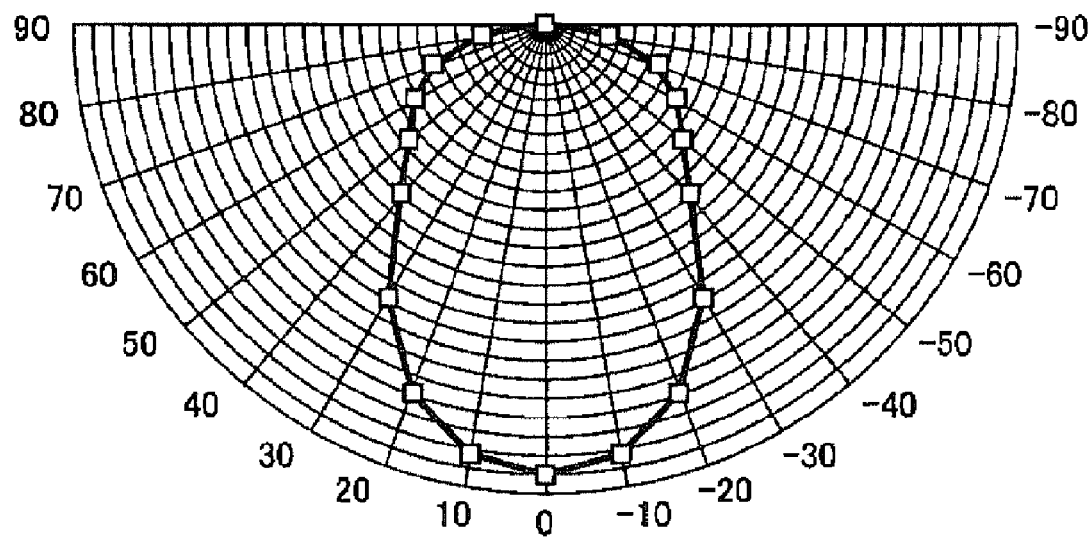
FIG. 18 is a view illustrating an example of a pattern of light distribution Ji in a substrate in the organic EL device according to the comparative example for achieving the maximization of luminance at the external front side in the even substrate surface structure shown in FIG. 17A.
Figure 19:
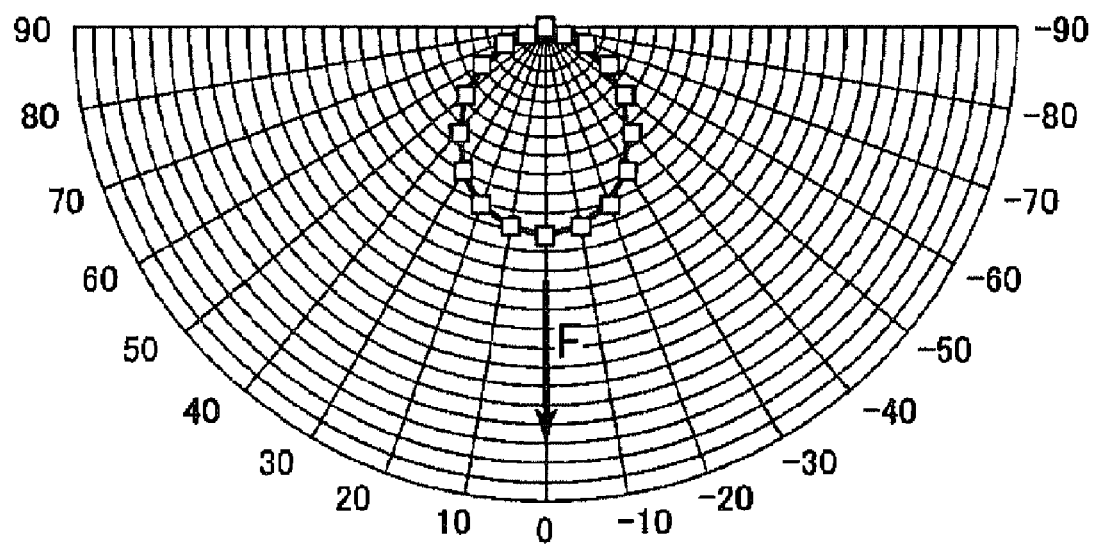
FIG. 19 is a view illustrating an example of a pattern of external light distribution Jo in the organic EL device according to the comparative example for achieving the maximization of luminance at the external front side in the even substrate surface structure shown in FIG. 17A.

FIGS. 18 and 19 illustrate examples of patterns of the light distribution Ji in the substrate and the external light distribution Jo, respectively, in the organic EL device according to the comparative example for achieving the maximization of luminance at the external front side in the substrate surface even structure shown in FIG. 17A.

Figure 20:
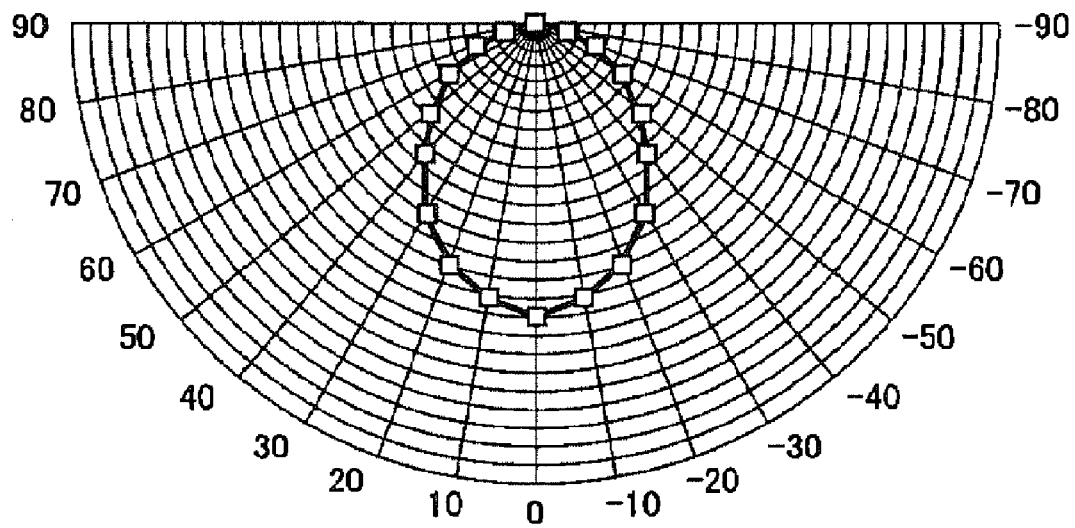
FIG. 20 is a view illustrating an example of a pattern of external light distribution Jo in the organic EL device according to the comparative example for achieving the maximization of luminance at the external front side in the uneven substrate surface structure shown in FIG. 17B.

FIG. 20 illustrates an example of a pattern of the external light distribution Jo in the organic EL device according to the comparative example for achieving the maximization of luminance at the external front side in the substrate surface uneven structure shown in FIG. 17B.

Figure 21:
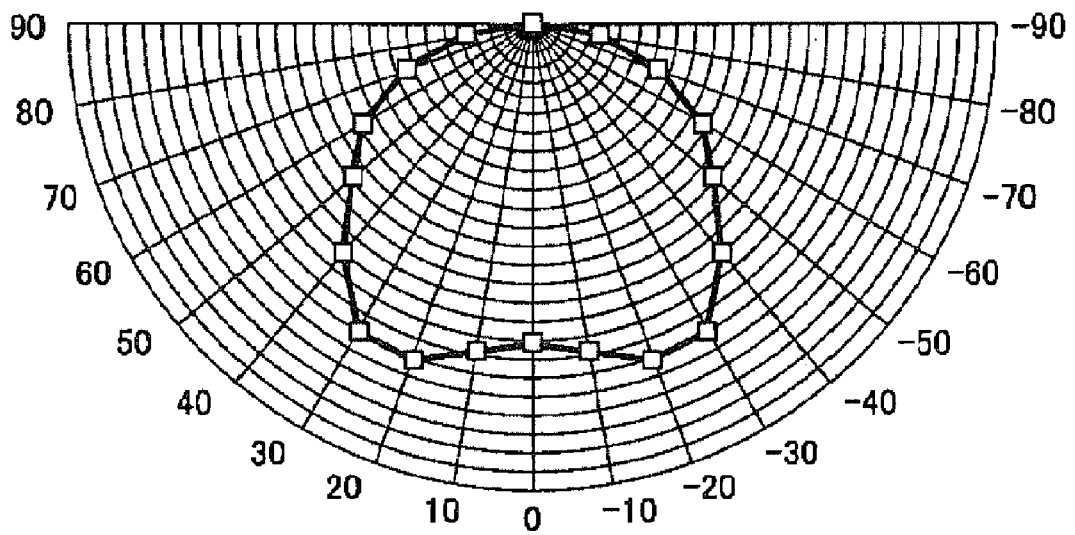
FIG. 21 is a view illustrating an example of a pattern of light distribution Ji in a substrate in the organic EL device according to the first embodiment for achieving the maximization of internal total light flux in the even substrate surface structure shown in FIG. 17A.
Figure 22:
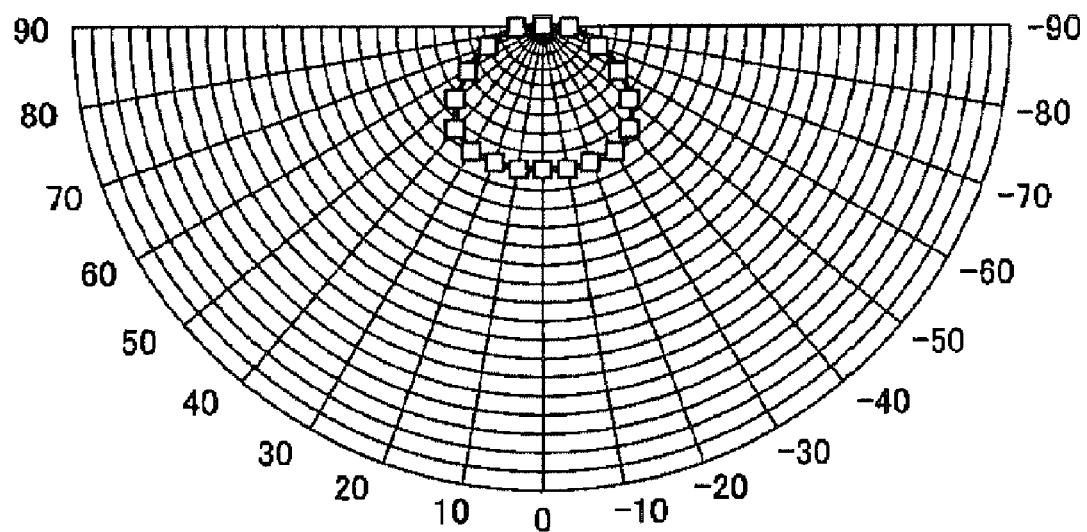
FIG. 22 is a view illustrating an example of a pattern of external light distribution Jo in the organic EL device according to the first embodiment for achieving the maximization of internal total light flux in the even substrate surface structure shown in FIG. 17A.

FIG. 21 illustrates an example of patterns of the light distribution Ji in the substrate and FIG. 22 illustrates an example of patterns of the external light distribution Jo, respectively, in the organic EL device 2 according to the first embodiment for achieving the maximization of internal total light flux in the even substrate surface structure shown in FIG. 17A.

Figure 23:
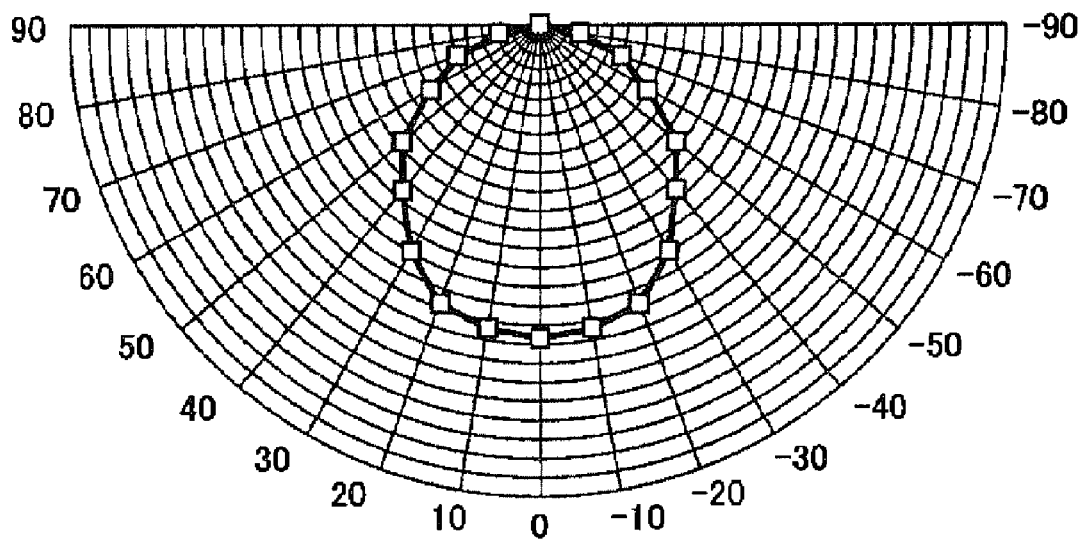
FIG. 23 is a view illustrating an example of a pattern of external light distribution Jo in the organic EL device according to the first embodiment for achieving the maximization of internal total light flux in the uneven substrate surface structure shown in FIG. 17B.

FIG. 23 illustrates an example of a pattern of the external light distribution Jo in the organic EL device 2 according to the first embodiment for achieving the maximization of internal total light flux in the uneven substrate surface 44 structure shown in FIG. 17B.

The total light flux of the light distribution Ji in the substrate in FIG. 18 is 31.31 m/W, while the total light flux of the light distribution Ji in the substrate in FIG. 21 is 37.2 m/W.

The total light flux of the external light distribution Jo in FIG. 19 is 15.41 m/W, while the total light flux of the external light distribution Jo in FIG. 22 is 17.81 m/W. It can be here seen that the total light flux in the organic EL device 2 according to the first embodiment is increased and improved by about 20% as compared to the comparative example, although a value of external front luminance in the front direction F in FIG. 19 is 44 cd/A while a value of external front luminance in the front direction F in FIG. 22 is 40.8 cd/A. In other words, a value of external front luminance in the organic EL device 2 according to the first embodiment is lower than that in the organic EL device according to the comparative example.

In addition, it can be seen that the total light flux in the organic EL device 2 according to the first embodiment is increased and improved by about 30% as compared to the comparative example in that the total light flux of the external light distribution Jo in FIG. 20 is 21.91 m/W while the total light flux of the external light distribution Jo in FIG. 23 is 27.81 m/W.

In addition, while an effect of improvement of the total light flux increases by about 1.43 times in comparison of FIGS. 19 and 20, an effect of improvement of the total light flux in the organic EL device 2 increases by about 1.56 times in comparison of FIGS. 22 and 23. Accordingly, it can be seen that the organic EL device 2 according to the first embodiment provides the light extraction efficiency further improved by the control of light distribution.

Figure 24:
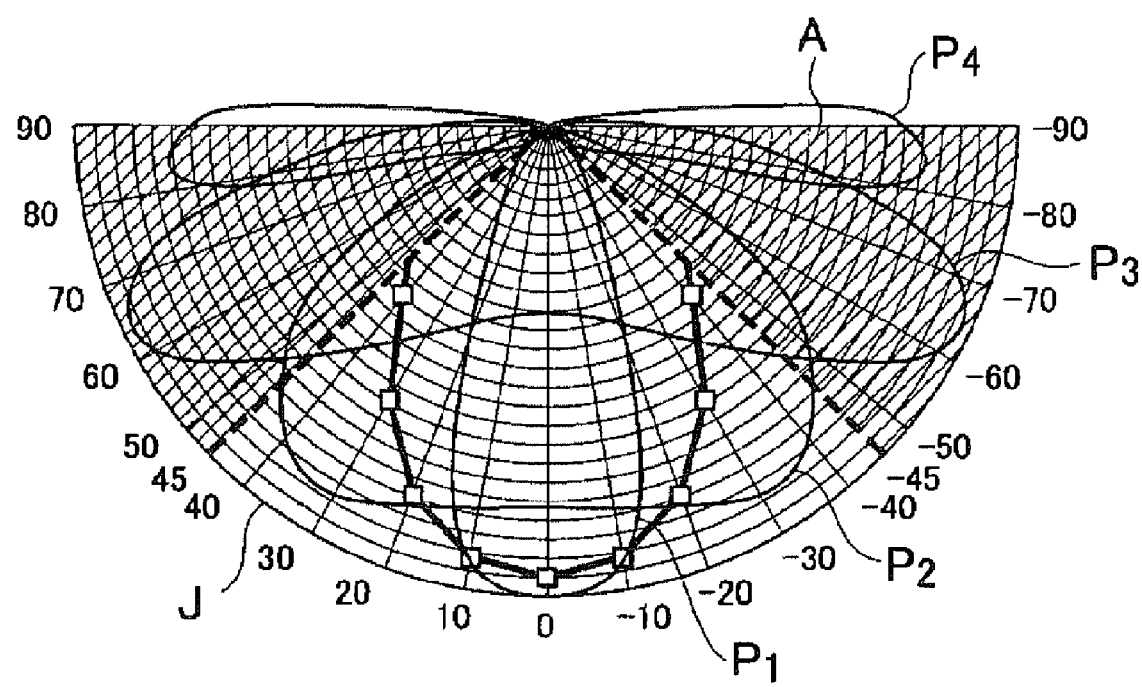
FIG. 24 is a view illustrating an example of a pattern of light distribution used to show a situation where a light distribution characteristic is controlled by adjusting film thickness of the organic EL layer in the organic EL device according to the first embodiment.

FIG. 24 illustrates an example of a pattern of light distribution showing a situation where a characteristic of a light distribution J is controlled by adjusting film thickness of the organic EL layer 40 in the organic EL device 2 according to the first embodiment. FIG. 24 also illustrates an example of a pattern of light distribution of the comparative example shown in FIG. 1B for comparison. In FIG. 24, a light distribution pattern P1 shows an example of front directionality and a light distribution pattern P4 shows an example of horizontal directionality. A light distribution pattern P3 shows an example of the maximum of luminance within a range of angle θ of 60 degrees to 70 degrees. A light distribution pattern P2 is different from these patterns and has the maximum of luminance within a range of angle θ of 20 degrees to 50 degrees, which shows an example corresponding to the organic EL device 2 according to the first embodiment for achieving the maximization of total light flux.

In the organic EL device 2 according to the first embodiment, the total light flux can be maximized by adjusting film thickness of the organic EL layer 40. For example, as shown in FIG. 7, the film thickness of the organic EL layer 40 can be adjusted by changing the emission position-cathode distance L while the thickness of the hole transfer layer 14 remains constant.

According to the first embodiment and the first to third modifications thereof, it is possible to provide a bottom emission type organic EL device with a light distribution controlled to improve an efficiency of light extraction.

<Second Embodiment>

Figure 25:
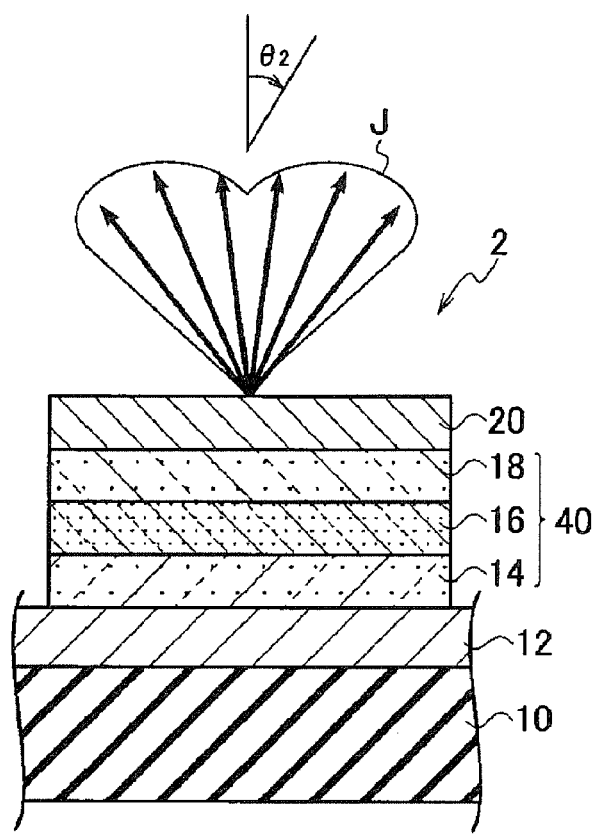
FIG. 25 is a schematic sectional view of an organic EL device according to a second embodiment.

As shown in FIG. 25, an organic EL device 2 according to a second embodiment includes a substrate 10, a first electrode layer 12 formed on the substrate 10, an organic EL layer 40 formed on the first electrode layer 12, and a second electrode layer 20 formed on the organic EL layer 40. In this embodiment, a distribution characteristic of light emitted from the second electrode layer 20 has a luminance in a direction of a second angle $\theta_2$ of 20 to 50 degrees measured with respect to an axis perpendicular to the second electrode layer 20 that is relatively high as compared to luminance in other angular directions. Accordingly, the characteristic of the distribution J of light emitted from the second electrode layer 20 in the organic EL device 2 according to the second embodiment is maximized in its total amount of light (total light flux). In this embodiment, the light emitted from the second electrode layer 20 propagates through, for example, an external air layer, etc. In addition, for the second angle $\theta_2$, a direction angle from the second electrode layer 20 to the external is set to 0 degree.

The organic EL layer 40 includes a hole transfer layer 14 formed on the first electrode layer 12, an organic emission layer 16 formed on the hole transfer layer 14, and an electron transfer layer 18 formed on the organic emission layer 16. In this embodiment, in the organic EL layer 40, the organic emission layer 16 is interposed between the hole transfer layer 14 and the electron transfer layer 18 in the stack order of, for example, the hole transfer layer 14, the organic emission layer 16 and the electron transfer layer 18 or in the stack order of the electron transfer layer 18, the organic emission layer 16 and the hole transfer layer 14 in the direction from the first electrode layer 12 to the second electrode layer 20. In other words, the stack order may be properly selected depending on a polarity of a bias voltage applied between the first electrode layer 12 and the second electrode layer 20.

The organic EL device 2 according to the second embodiment has a top emission structure in which the second electrode layer 20 is formed of a transparent electrode having an emission surface and the first electrode layer 12 is formed of a metal layer, as shown in FIG. 25.

In this embodiment, the substrate 10 may be formed of, for example, a silicon substrate or a stainless substrate. The first electrode layer 12 may be formed of, for example, an aluminum deposition film. The second electrode layer 20 may be formed of, for example, ITO.

The first electron layer 12 may be formed of a film made of, for example, Al, Ag, etc. having a high reflectivity.

The second electrode layer 20 may be formed of a transparent electrode of indium tin oxide (ITO) having thickness of, for example, about 50 nm to 500 nm. In addition, the second electrode layer 20 may be formed of indium zinc oxide (IZO), antimony tin oxide (ATO) or PEDOTT-PSS. In addition, the second electrode layer 12 may be a translucent electrode film made of metal such as Ag, etc.

In the organic EL device 2 according to the second embodiment, when top emission light is obliquely output from a surface of the second electrode layer 20, the total amount of light (total light flux) of the distribution J of light emitted from the second electrode layer can be improved. Other configurations in this embodiment are the same as those in the first embodiment and therefore, explanation of which will not be repeated.

<First Modification>

Figure 26:
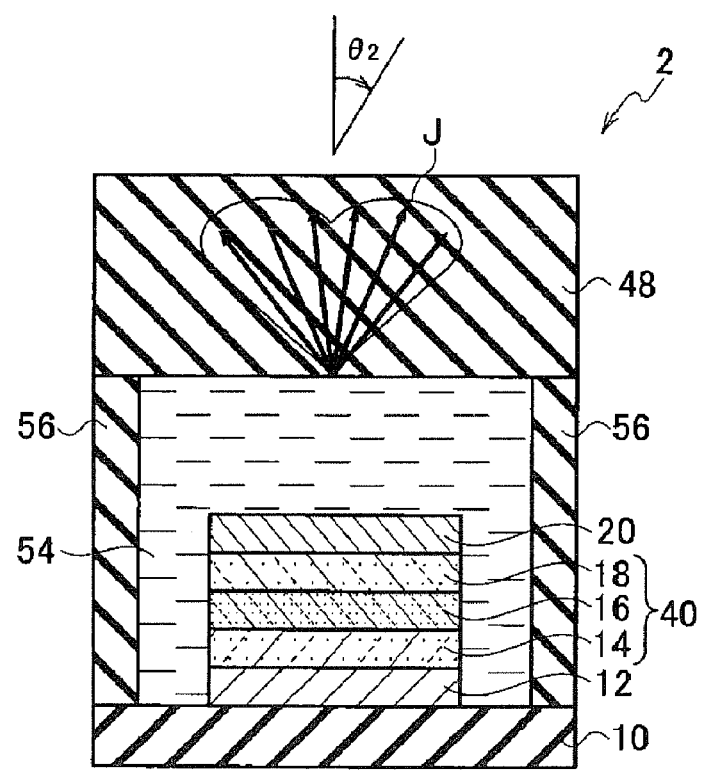
FIG. 26 is a schematic sectional view of an organic EL device according to a first modification of the second embodiment.

As shown in FIG. 26, the organic EL device 2 according to a first modification of the second embodiment includes a sealing member 56 formed on the substrate 10, a sealing plate 48 formed on the sealing member 56, and a filler 54 filling a gap between the sealing member 56 and the sealing plate 48, and between the organic EL layer 40, the first electrode layer 12 and the second electrode layer 20. In this modification, the organic EL layer 40, the first electrode layer 12 and the second electrode layer 20 are sealed by the sealing member 56 and the sealing plate 48. In addition, a distribution characteristic of light emitted from the second electrode layer 20 into the sealing plate 48 has a luminance in a direction of a second angle $\theta_2$ of 20 to 50 degrees measured with respect to an axis perpendicular to the second electrode layer 20 that is relatively high as compared to luminance in other angular directions.

The filler 54 may be made of a solid or liquid resin, glass, fluoro-based oil or gel, or rare gas. The filler 54 may be transparent.

The sealing member 56 may be made of UV curable resin, glass fit, etc.

The sealing plate 48 may be formed of a polymer resin substrate, a glass substrate, etc.

A surface of the sealing plate 48 may include a random or regular unevenness structure.

A surface of the sealing plate 48 may include a light extraction film having random or regular unevenness.

Although it is shown in FIG. 26 that the sealing member 56 is directly formed on the substrate 10, the sealing member 56 may be formed on the first electrode layer 12, which is placed on the substrate 10. For example, the first electrode layer 12 may be formed on the substrate 10 and the sealing member 56 may be formed on the first electrode layer 12 through a patterning process. Other configurations in this modification are similar as those in the second embodiment, and a description of these similar configurations will not be repeated.

<Second Modification>

Figure 27:
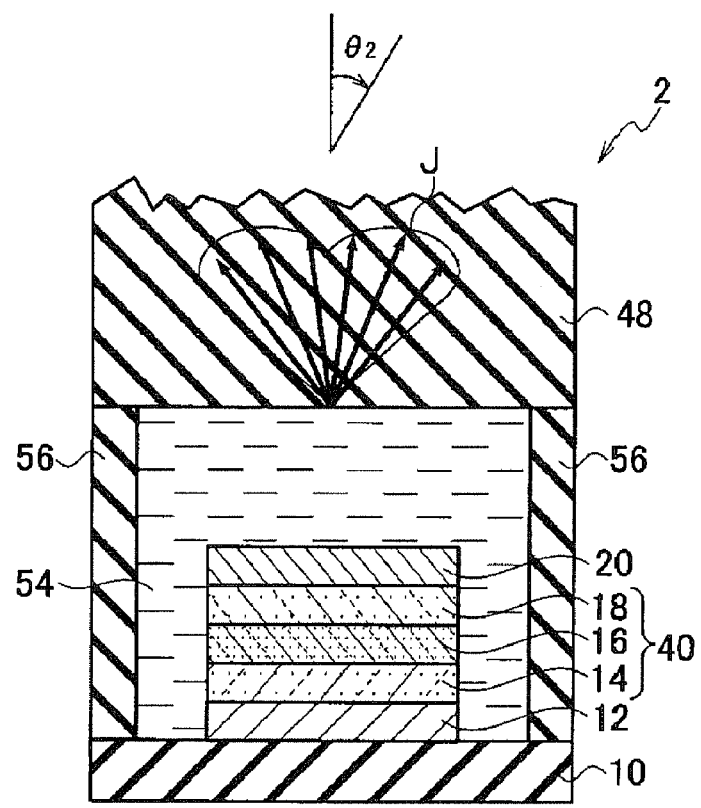
FIG. 27 is a schematic sectional view of an organic EL device according to a second modification of the second embodiment.

As shown in FIG. 27, an organic EL device 2 according to a second modification of the second embodiment includes a randomly uneven structure formed on a surface of the sealing plate 48.

In the organic EL device 2 according to the second modification of the second embodiment, by forming the randomly uneven structure on an emission surface of the sealing plate 48, it is possible to extract light with the second angle $\theta_2$ measured with respect to an axis perpendicular to the second electrode layer 20 larger than light with the total internal refection angle. That is, by providing unevenness for the emission surface of the sealing plate 48, origin light components of total reflection can be also extracted out of the sealing plate 48, thereby improving final emission efficiency. Other configurations in this modification are similar as those in the second embodiment, and are not repeated here.

<Third Modification>

Figure 28:
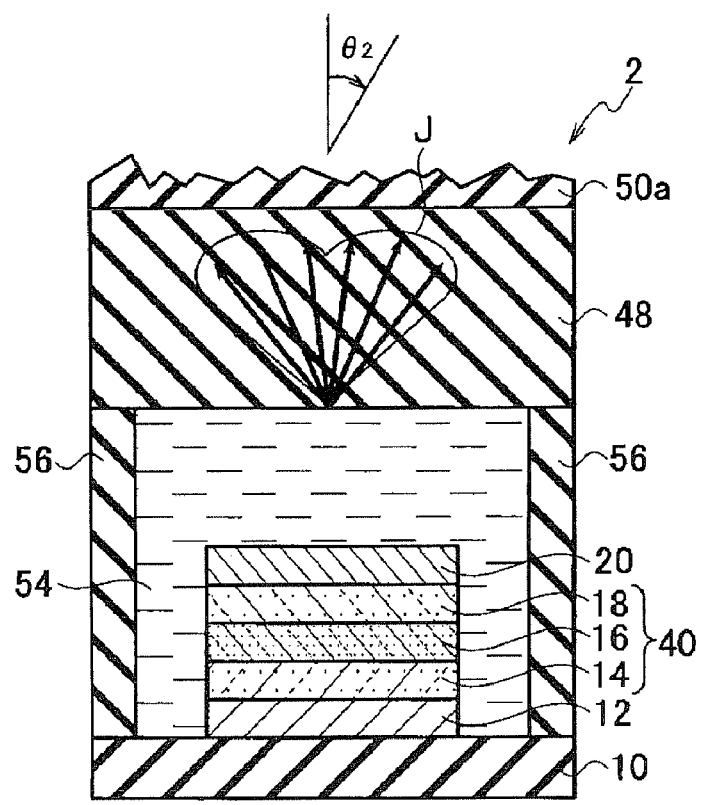
FIG. 28 is a schematic sectional view of an organic EL device according to a third modification of the second embodiment.

As shown in FIG. 28, an organic EL device 2 according to a third modification of the second embodiment includes a light extraction film 50a having random unevenness formed on the surface of the sealing plate 48. The light extraction film 50a may be formed of, for example, a prism sheet, etc. Other configurations in this modification are the same as those in the second embodiment.

<Fourth Modification>

Figure 29:
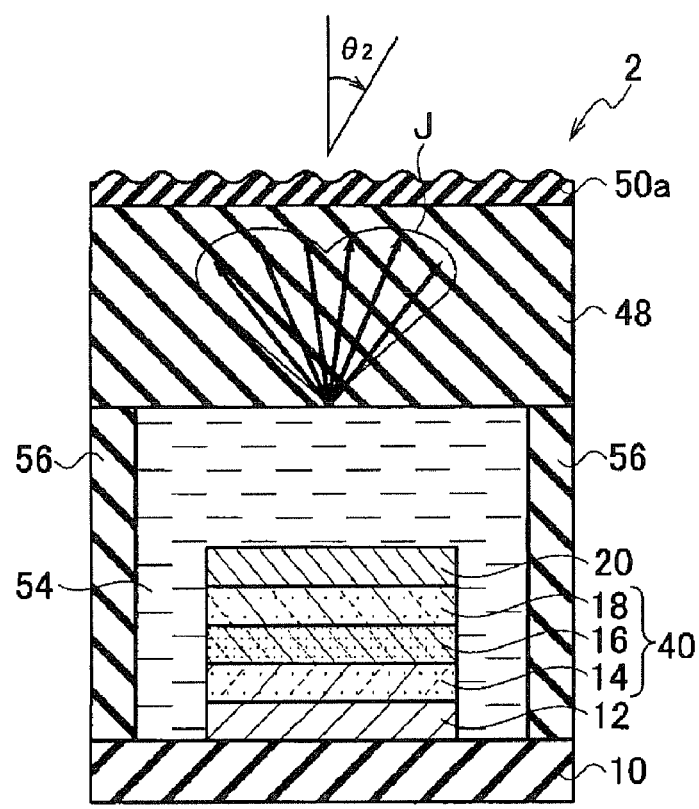
FIG. 29 is a schematic sectional view of an organic EL device according to a fourth modification of the second embodiment.

As shown in FIG. 29, an organic EL device 2 according to a fourth modification of the second embodiment includes a light extraction film 50a having regular unevenness formed on the surface of the sealing plate 48. Other configurations in this modification are the same as those in the second embodiment.

<Fifth Modification>

Figure 30:
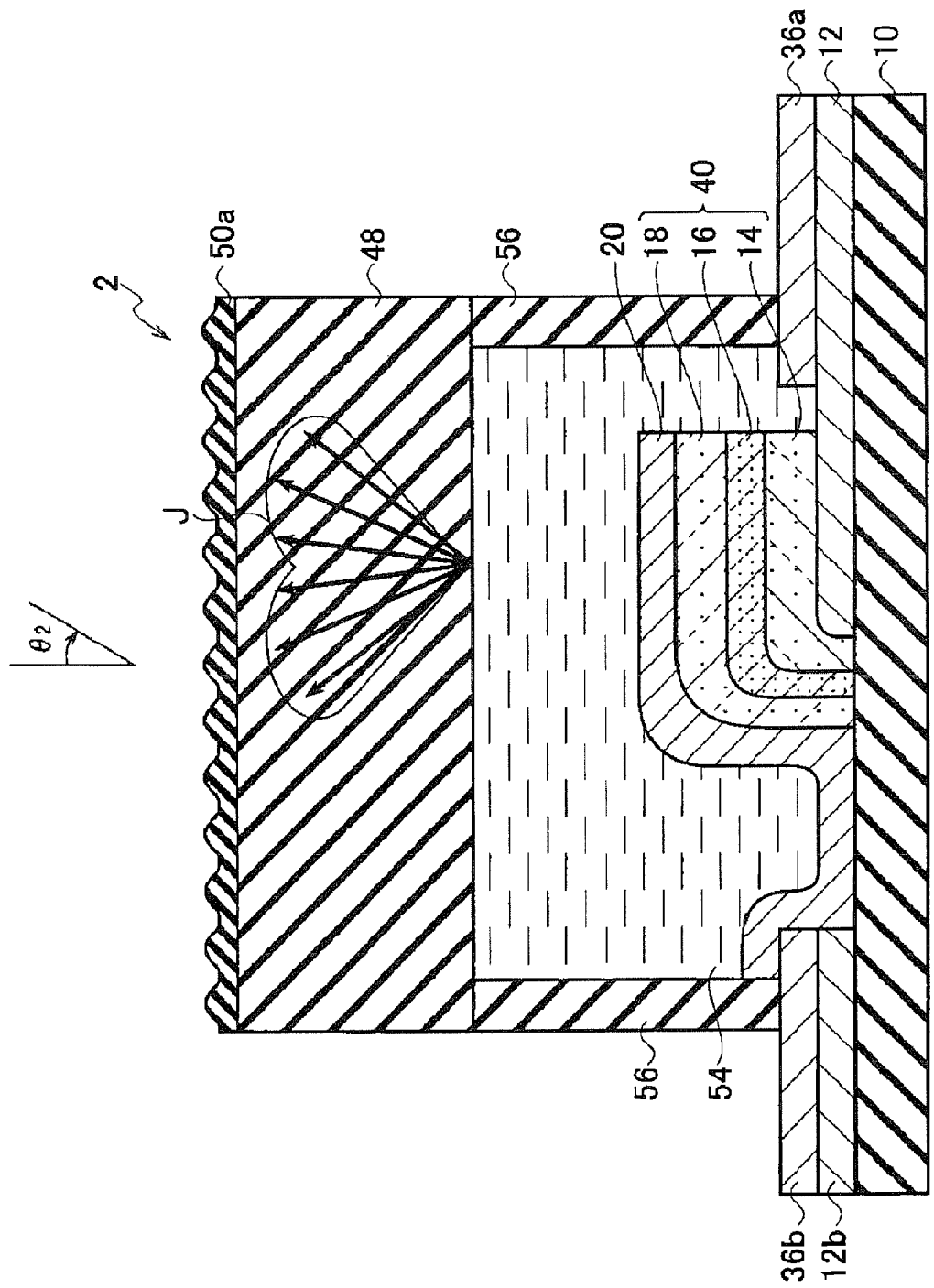
FIG. 30 is a schematic sectional view of an organic EL device according to a fifth modification of the second embodiment.

As shown in FIG. 30, an organic EL device 2 according to a fifth modification of the second embodiment includes auxiliary wirings 36a and 36b.

As shown in FIG. 30, the organic EL device 2 according to the fifth modification of the second embodiment includes a sealing member 56 formed on the auxiliary wirings 36a and 36b, and a sealing plate 48 formed on the sealing member 56. A filler 54 filling a gap between the sealing member 56 and the sealing plate 48, and between the organic EL layer 40, the first electrode layer 12 and the second electrode layer 20. The organic EL layer 40, the first electrode layer 12 and the second electrode layer 20 are sealed by the sealing member 56 and the sealing plate 48.

In the organic EL device 2 according to the fifth modification of the second embodiment, as shown in FIG. 30, the sealing member 56 is formed on the auxiliary wiring 36a, with the first electrode layer 12 interposed between the substrate 10 and the auxiliary wiring 36a. In addition, the sealing member 56 is formed on the auxiliary wiring 36b which is connected to the second electrode layer 20. An electrode layer 12b is formed, on the substrate 10 and electrically isolated from the first electrode layer 12. Like the fourth modification shown in FIG. 29, a light extraction film 50a may be provided on a surface of the sealing plate 48.

According to the second embodiment and the first to fifth modifications, since the organic EL layer 30, the first electrode layer 12 and the second electrode layer 20 are sealed and the filler 54 fills the gap therebetween, it is possible to improve durability of the organic EL device.

In addition, according to the third to fifth modifications of the second embodiment, the formed light extraction film 50a allows light to be extracted from the sealing plate 48 with higher efficiency. Other configurations in this modification are the same as those in the second embodiment.

<Sixth Modification>

Figure 31:
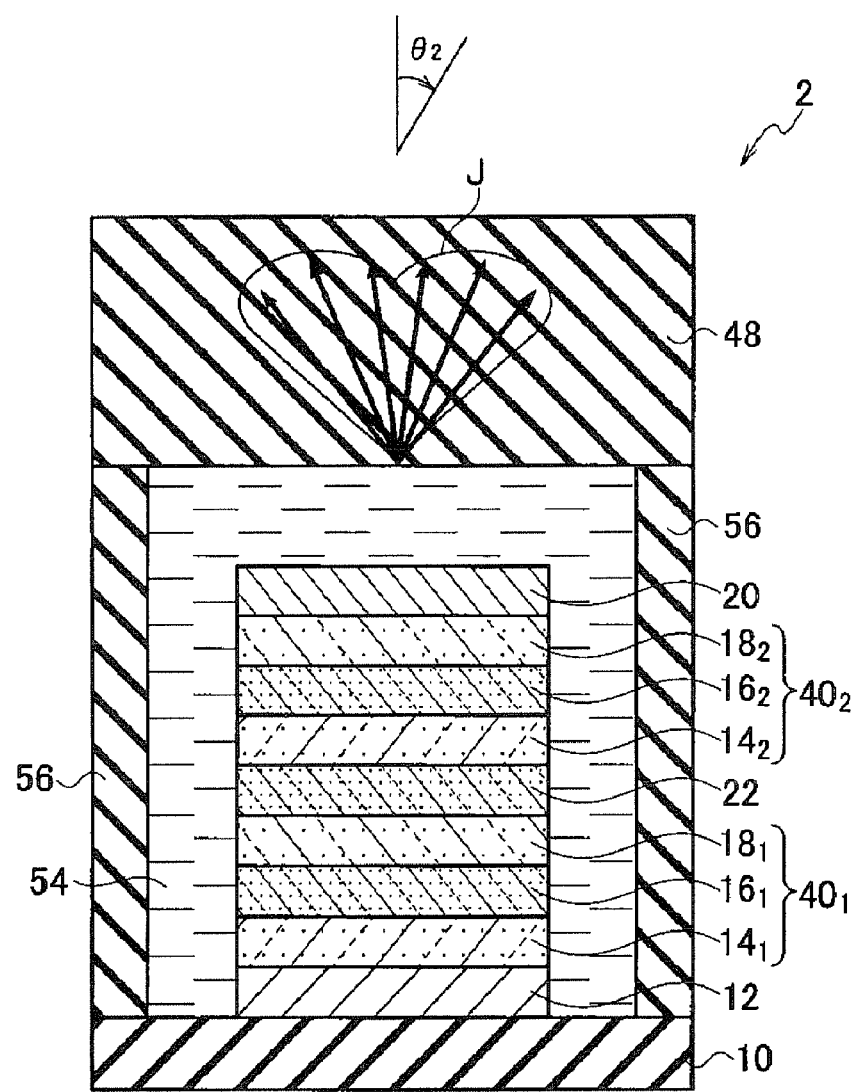
FIG. 31 is a schematic sectional view of an organic EL device according to a sixth modification of the second embodiment.

As shown in FIG. 31, an organic EL device 2 according to a sixth modification of the second embodiment has a MPE type structure including one or more charge generating layers and a plurality of emission units containing two or more organic emission layers.

As shown in FIG. 31, the organic EL device 2 according to the sixth modification of the second embodiment generally includes a substrate 10 and a first electrode layer 12 formed on the substrate 10. The organic EL device 2 further includes a plurality of emission units $40_1$, $40_2$, (and $40_3$ or more if applicable) which is stacked on the first electrode layer 12 and includes hole transfer layers $14_1$, $14_2$, (and $14_3$ or more if applicable), electron transfer layers $18_1$, $18_2$, (and $18_3$ or more if applicable) and organic emission layers $16_1$, $16_2$, (and $16_3$ or more if applicable) interposed therebetween. In addition, a second electrode layer 20 is formed on the emission unit $40_2$ and is formed on the top in the stack direction in the plurality of emission units $40_1$ and $40_2$. The charge generating layer 22 (which may include a plurality of layers $22_1$, $22_2$, ..., $22_n$) is interposed between the emission units. In this modification, a distribution characteristic of light emitted from the second electrode layer 20 has a luminance in a direction of a second angle $\theta_2$ of 20 to 50 degrees measured with respect to an axis perpendicular to the second electrode layer 20 that is relatively high as compared to luminance in other angular directions. Accordingly, the characteristic of the distribution J of light emitted from the second electrode layer 20 in the organic EL device 2 according to the sixth modification of the second embodiment is maximized in its total amount of light (total light flux).

The plurality of emission units $40_1$ and $40_2$ includes the hole transfer layers $14_1$ and $14_2$, the electron transfer layers $18_1$ and $18_2$, and the organic emission layers $16_1$ and $16_2$, interposed therebetween. They are stacked, for example, in the stack order of the hole transfer layers $14_1$ and $14_2$, the organic emission layers $16_1$ and $16_2$, and the electron transfer layers $18_1$ and $18_2$, or in the stack order of the electron transfer layers $18_1$ and $18_2$, the organic emission layers $16_1$ and $16_2$ and the hole transfer layers $14_1$ and $14_2$ in the direction from the first electrode layer 12 to the second electrode layer 20. In other words, the stack order may be properly selected depending on a polarity of a bias voltage applied between the first electrode layer 12 and the second electrode layer 20.

Specifically, as shown in FIG. 31, the organic EL device 2 according to the sixth modification of the second embodiment includes the substrate 10 and the first electrode layer 12 formed on the substrate 10. The organic EL device 2 further includes the first emission unit $40_1$, which is stacked on the first electrode layer 12 and includes the first hole transfer layer $14_1$, the first electron transfer layer $18_1$ and the first organic emission layers $16_1$ interposed therebetween. In addition, the second emission unit $40_2$ is stacked on the first emission unit $40_1$ and includes the second hole transfer layer $14_2$, the second organic emission layers $16_2$ and the second electron transfer layer $18_2$ stacked in order. Moreover, the organic EL device 2 includes the charge generating layer 22 interposed between the first emission unit $40_1$ and the second emission unit $40_2$. The second electrode layer 20 is formed on the emission unit $40_2$ and is formed on the top in the stack direction. In this modification, a distribution characteristic of light emitted from the second electrode layer 20 has a luminance in a direction of a second angle $\theta_2$ of 20 to 50 degrees measured with respect to an axis perpendicular to the second electrode layer 20 that is relatively high as compared to luminance in other angular directions.

As shown in FIG. 31, the organic EL device 2 according to the sixth modification of the second embodiment includes a sealing member 56 formed on the substrate 10, a sealing plate 48 formed on the sealing member 56, and a filler 54 filling a gap between the sealing member 56 and the sealing plate 48, and between the plurality of emission units $40_1$ and $40_2$, the charge generating layer 22, the first electrode layer 12 and the second electrode layer 20. In this modification, the plurality of emission units $40_1$ and $40_2$, the charge generating layers 22, the first electrode layer 12 and the second electrode layer 20 are sealed by the sealing member 56 and the sealing plate 48.

Further, a distribution characteristic of light emitted from the second electrode layer 20 into the sealing plate 48 has a luminance in a direction of a second angle $\theta_2$ of 20 to 50 degrees measured with respect to an axis perpendicular to the second electrode layer 20 that is relatively high as compared to luminance in other angular directions.

The filler 54 may be made of solid or liquid resin, glass, fluoro-based oil or gel, or rare gas. The filler 54 may be transparent.

The sealing member 56 may be made of UV curable resin, glass fit, etc.

The sealing plate 48 may be formed of a polymer resin substrate, a glass substrate, etc.

A surface of the sealing plate 48 may include a random or regular unevenness structure.

A surface of the sealing plate 48 may include a light extraction film having random or regular unevenness.

Although it is shown in FIG. 31 that the sealing member 56 is directly formed on the substrate 10, the sealing member 56 may be formed on the first electrode layer 12, which is placed on the substrate 10. For example, the first electrode layer 12 may be formed on the substrate 10 and the sealing member 56 may be formed on the first electrode layer 12 through a patterning process. Like FIG. 30, the organic EL device 2 according to the sixth modification of the second embodiment may further include auxiliary wirings 36a and 36b. Other configurations in this modification are the same as those in the second embodiment.

<Seventh Modification>

Figure 32:
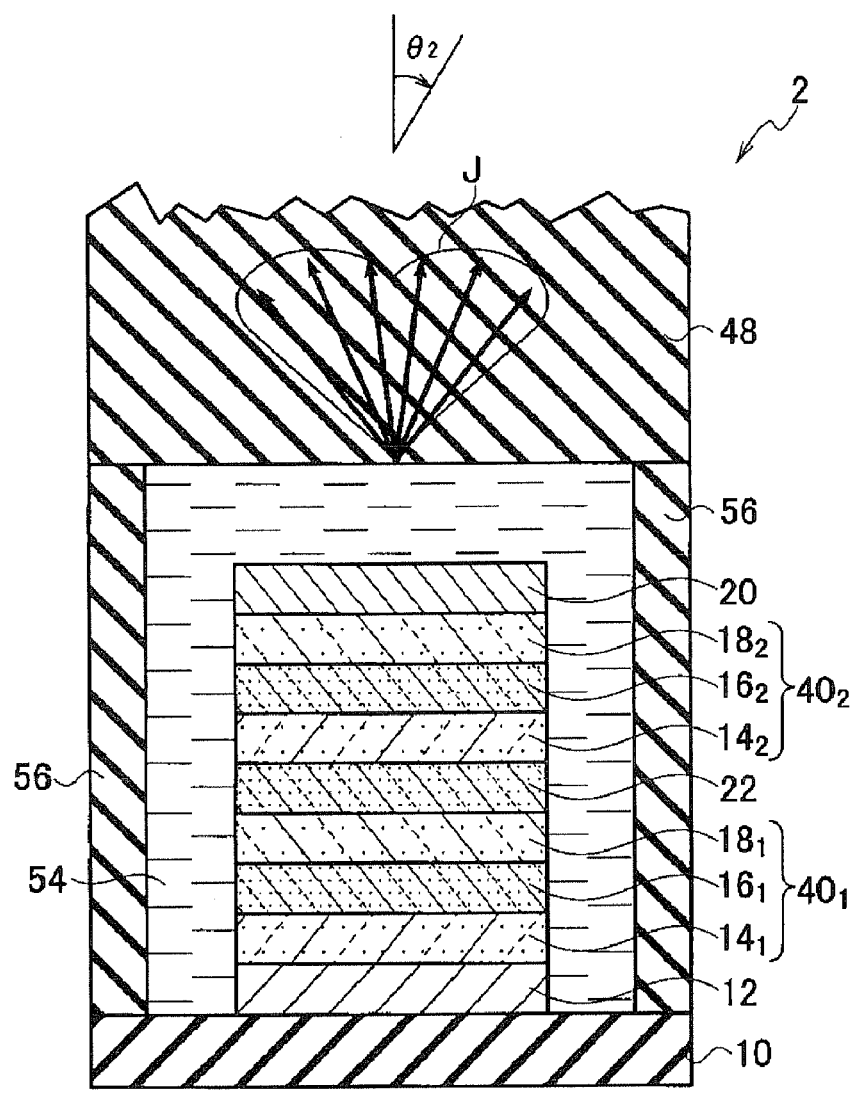
FIG. 32 is a schematic sectional view of an organic EL device according to a seventh modification of the second embodiment.

As shown in FIG. 32, an organic EL device 2 according to a seventh modification of the second embodiment includes a randomly uneven structure formed on a surface of the sealing plate 48.

In the organic EL device 2 according to the seventh modification of the second embodiment, by forming the randomly uneven structure on an emission surface of the sealing plate 48, it is possible to extract light with the second angle $\theta_2$ measured with respect to an axis perpendicular to the second electrode layer 20 larger than light with the total internal refection angle. That is, by providing unevenness for the emission surface of the sealing plate 48, original light components of total reflection can be also extracted out of the sealing plate 48, thereby improving final emission efficiency. Other configurations in this modification are similar to those in the sixth modification of the second embodiment, and the description to those configurations will not be repeated.

<Eighth Modification>

Figure 33:
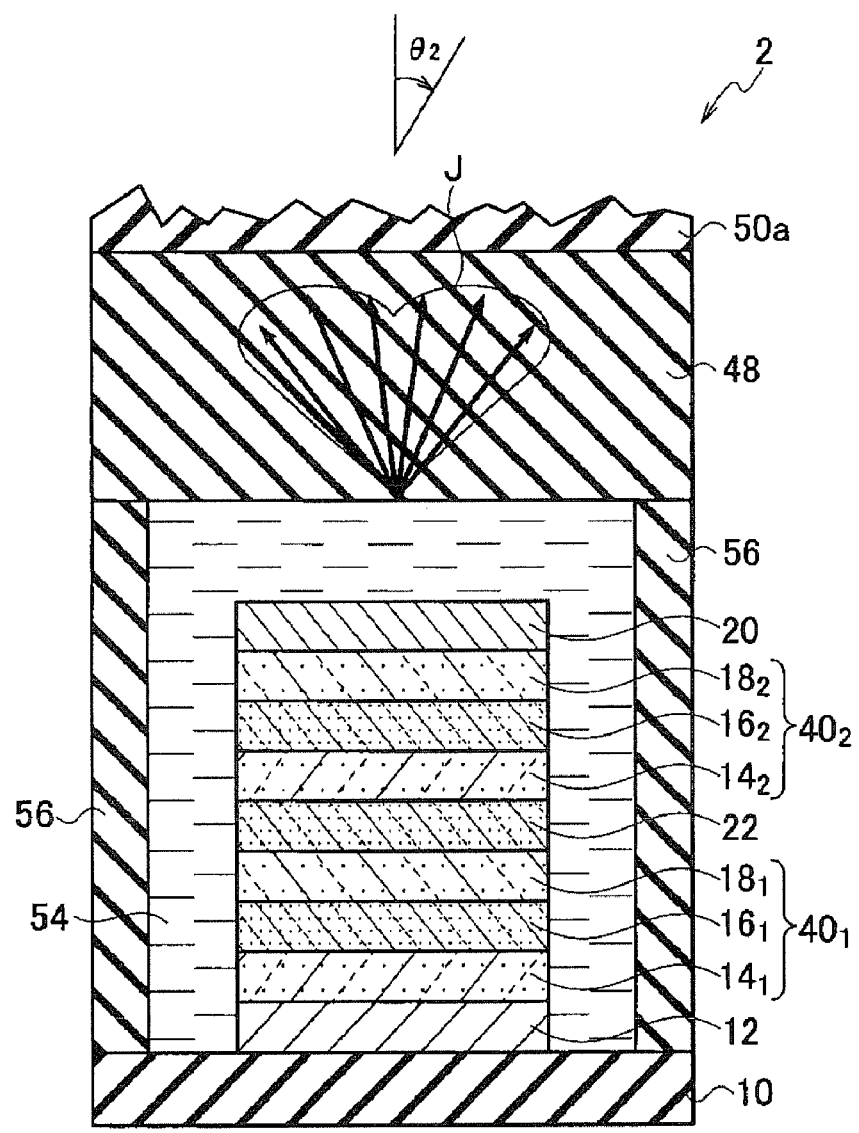
FIG. 33 is a schematic sectional view of an organic EL device according to an eighth modification of the second embodiment.

As shown in FIG. 33, an organic EL device 2 according to an eighth modification of the second embodiment includes a light extraction film 50a having random unevenness formed on the surface of the sealing plate 48. The light extraction film 50a may be formed of, for example, a prism sheet, etc. Other configurations in this modification are the same as those in the sixth modification of the second embodiment.

<Ninth Modification>

Figure 34:
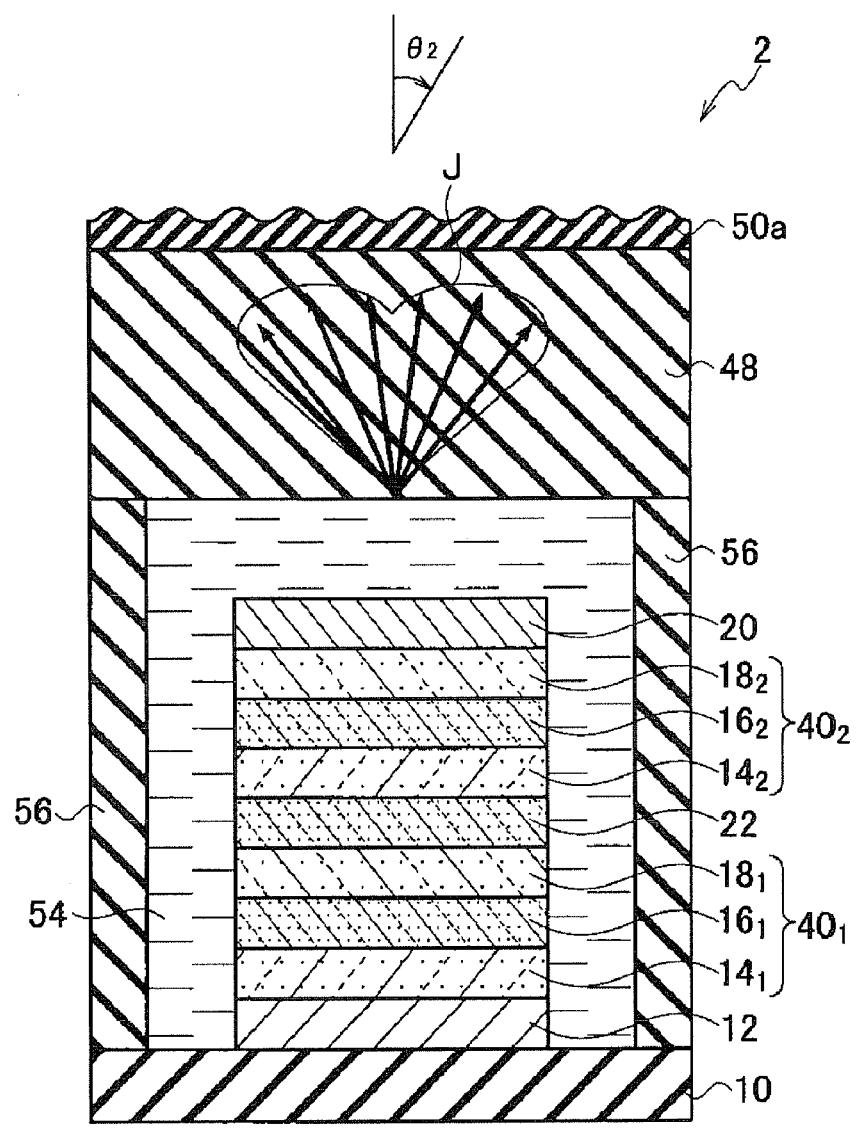
FIG. 34 is a schematic sectional view of an organic EL device according to a ninth modification of the second embodiment.

As shown in FIG. 34, an organic EL device 2 according to a ninth modification of the second embodiment includes a light extraction film 50a having regular unevenness formed on the surface of the sealing plate 48. Other configurations in this modification are the same as those in the sixth modification of the second embodiment.

According to the sixth to ninth modifications, since the organic EL layer 30, the first electrode layer 12 and the second electrode layer 20 are sealed by sealing member 56 and sealing plate 58 and the filler 54 fills the gap therebetween, it is possible to improve durability of the organic EL device.

In addition, according to the eighth and ninth modifications of the second embodiment, the formed light extraction film 50a allows light to be extracted from the sealing plate 48 with higher efficiency.

According to the second embodiment and the first to ninth modifications thereof, it is possible to provide an organic EL device with a light distribution controlled to improve an efficiency of light extraction.

<Third Embodiment>

Figure 35:
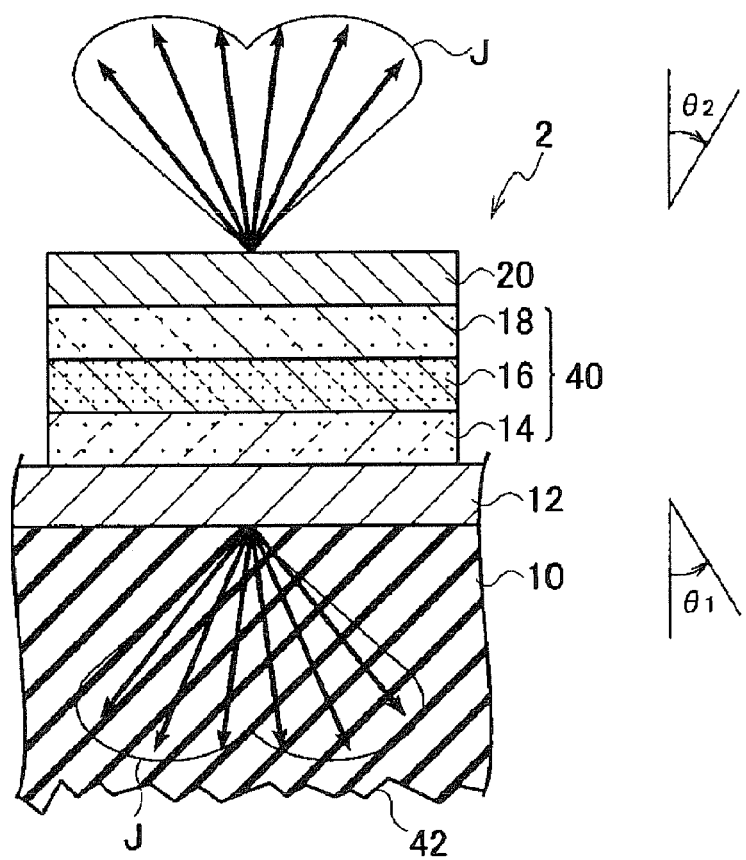
FIG. 35 is a schematic sectional view of an organic EL device according to a third embodiment.

As shown in FIG. 35, an organic EL device 2 according to a third embodiment includes a substrate 10 transmitting light, a first electrode layer 12 formed on the substrate 10, an organic EL layer 40 formed on the first electrode layer 12, and a second electrode layer 20 formed on the organic EL layer 40. In this embodiment, a distribution characteristic of light emitted from the first electrode layer 12 into the substrate 10 and a distribution characteristic of light emitted from the second electrode layer 20 have a luminance in a direction of a first angle $\theta_1$ of 20 to 50 degrees measured with respect to an axis perpendicular to the substrate 10 that is relatively high as compared to luminance in other angular directions. Further, luminance in a direction of a second angle $\theta_2$ of 20 to 50 degrees measured with respect to an axis perpendicular to the second electrode layer 20 is relatively high as compared to luminance in other angular directions. Accordingly, in the organic EL device 2 according to the third embodiment, the characteristic of the light distribution J in the substrate is maximized in its total amount of light (total light flux) and the characteristic of the distribution J of light emitted from the second electrode layer 20 is maximized in its total amount of light (total light flux). In this embodiment, the light emitted from the second electrode layer 20 propagates through, for example, an external air layer, etc.

The organic EL layer 40 includes a hole transfer layer 14 formed on the first electrode layer 12, an organic emission layer 16 formed on the hole transfer layer 14, and an electron transfer layer 18 formed on the organic emission layer 16. In this embodiment, in the organic EL layer 40, the organic emission layer 16 is interposed between the hole transfer layer 14 and the electron transfer layer 18. The stack order may be the order of the hole transfer layer 14, the organic emission layer 16 and the electron transfer layer 18 or the order of the electron transfer layer 18, the organic emission layer 16 and the hole transfer layer 14 in the direction from the first electrode layer 12 to the second electrode layer 20. In other words, the stack order may be properly selected depending on a polarity of a bias voltage applied between the first electrode layer 12 and the second electrode layer 20.

The organic EL device 2 according to the third embodiment has a top and bottom emission structure in which both of the first electrode layer 12 and the second electrode layer 20 are formed of a transparent electrode having an emission surface, as shown in FIG. 35.

The substrate 10 is a transparent substrate which transmits light, such as a glass substrate, a plastic film attached with a gas barrier film, etc. The substrate 10 has thickness of, for example, about 0.1 mm to 1.1 mm. In addition, the substrate 10 may be provided with flexibility using a transparent resin such as polycarbonate, polyethylene terephthalate (PET), etc.

The first electrode layer 12 and the second electrode layer 20 may be formed of a transparent electrode of indium tin oxide (ITO) having thickness of, for example, about 50 nm to 500 nm. In addition, the first electrode layer 12 and the second electrode layer 20 may be formed of indium zinc oxide (IZO), antimony tin oxide (ATO) or PEDOTT-PSS. In addition, the first electrode layer 12 and the second electrode layer 20 may be a translucent electrode film made of metal such as Ag, etc.

In the organic EL device 2 according to the third embodiment, by outputting bottom emission light obliquely from a surface of the first electrode layer 12, the total amount of light (total light flux) of the distribution J of light emitted into the substrate 10 can be improved. Further, by outputting top emission light obliquely from a surface of the second electrode layer 20, the total amount of light (total light flux) of the distribution J of light emitted from the second electrode layer 20 can be improved. Other configurations in this embodiment are the same as those in the first and second embodiments and therefore, explanation of which will not be repeated.

<First Modification>

Figure 36:
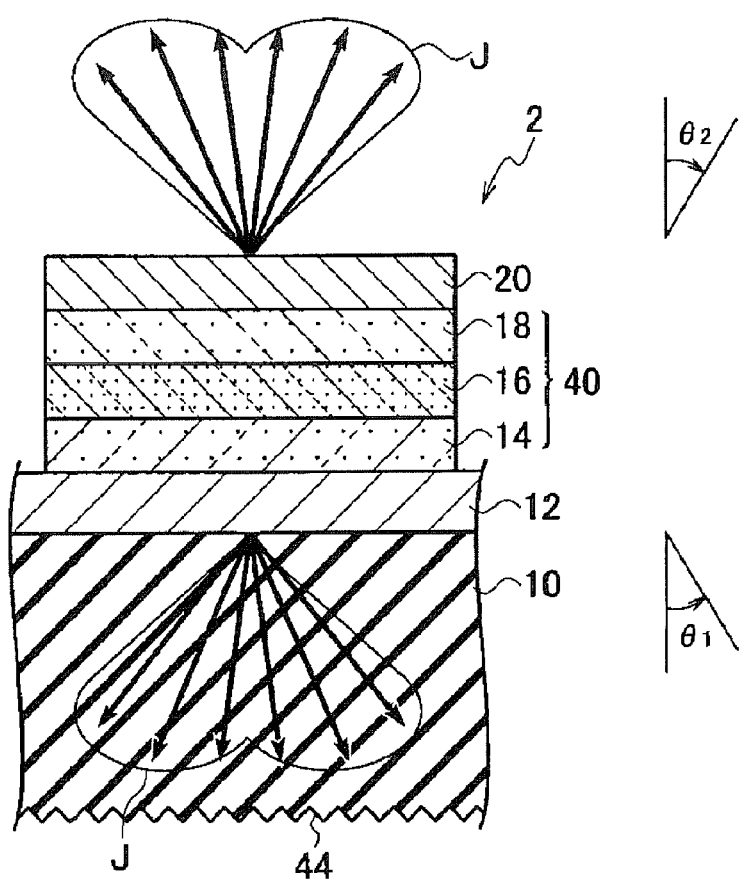
FIG. 36 is a schematic sectional view of an organic EL device according to a first modification of the third embodiment.

As shown in FIG. 36, an organic EL device 2 according to a first modification of the third embodiment includes uneven surface 44. The uneven surface 44 is patterned into a predetermined pattern structure on a rear surface in the opposite side to a front surface on which the first electrode layer 12 of the substrate 10 is formed.

In this modification, examples of the predetermined pattern structure may include a circular pattern, a triangle-based circular pattern, a square pattern, a rectangular pattern and the like.

In the organic EL device 2 according to the first modification of the third embodiment, by providing the uneven surface 44 patterned into the predetermined pattern structure, it is possible to extract light with the first angle $\theta_1$ larger than the total internal refection angle measured with respect to an axis perpendicular to the substrate 10. Other configurations in this modification are the same as those in the third embodiment and therefore, explanation of which will not be repeated.

<Second Modification>

Figure 37:
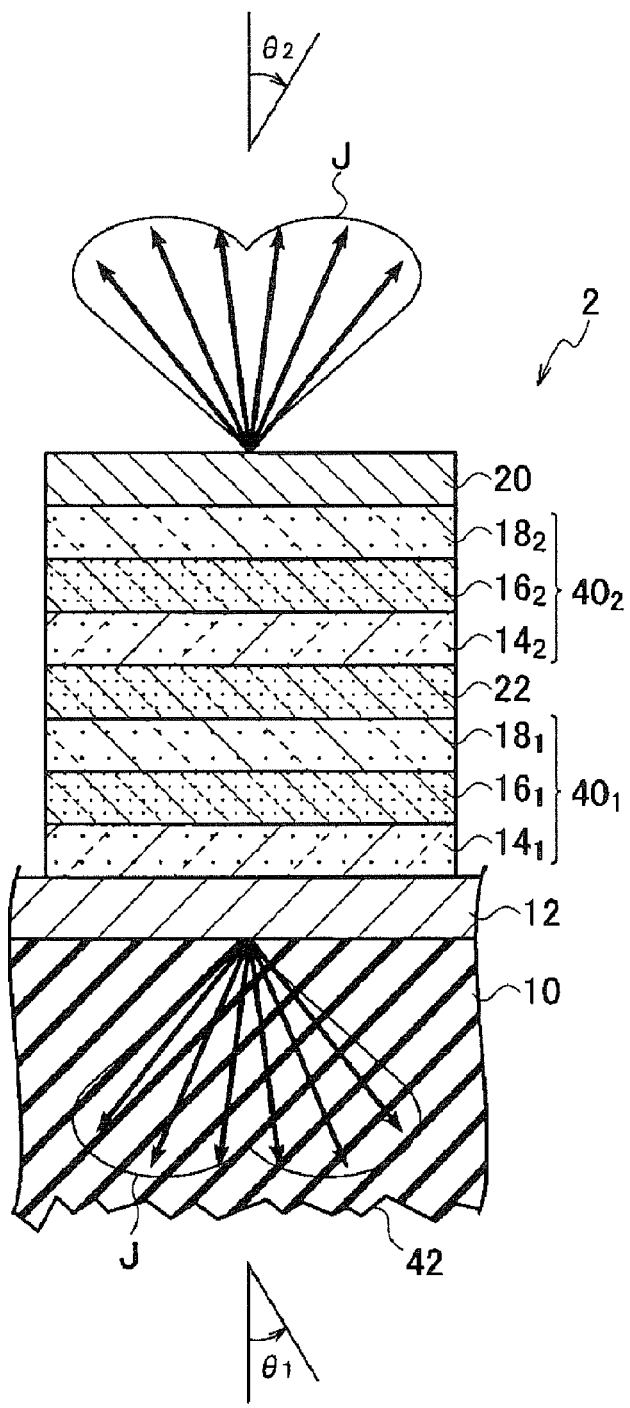
FIG. 37 is a schematic sectional view of an organic EL device according to a second modification of the third embodiment.

As shown in FIG. 37, an organic EL device 2 according to a third modification of the third embodiment has a MPE type structure including one or more charge generating layers and a plurality of emission units containing two or more organic emission layers.

As shown in FIG. 37, the organic EL device 2 according to the second modification of the third embodiment generally includes a substrate 10 and a first electrode layer 12 formed on the substrate 10, which transmit light. Further, the organic EL device 2 includes a plurality of emission units $40_1$, $40_2$, (and $40_3$ or more if applicable) which are stacked on the first electrode layer 12 and includes hole transfer layers $14_1$, $14_2$, (and $14_3$ or more if applicable), electron transfer layers $18_1$, $18_2$, (and $18_3$ or more if applicable) and organic emission layers $16_1$, $16_2$, (and $16_3$ or more if applicable) interposed therebetween. In addition, a second electrode layer 20 transmitting light is formed on the emission unit $40_2$ and is formed on the top in the stack direction in the plurality of emission units $40_1$ and $40_2$. The charge generating layer 22 (which may include a plurality of layers $22_1$, $22_2$, ..., $22_n$) is interposed between the emission units. In this modification, a distribution characteristic of light emitted from the first electrode layer 12 into the substrate 10 and a distribution characteristic of light emitted from the second electrode layer 20 have a luminance in a direction of a first angle $\theta_1$ of 20 to 50 degrees measured with respect to an axis perpendicular to the substrate 10 that is relatively high as compared to luminance in other angular directions, and a luminance in a direction of a second angle $\theta_2$ of 20 to 50 degrees measured with respect to an axis perpendicular to the second electrode layer that is relatively high as compared to luminance in other angular directions.

In this modification, the plurality of emission units $40_1$ and $40_2$ includes the hole transfer layers $14_1$ and $14_2$, the electron transfer layers $18_1$ and $18_2$, and the organic emission layers $16_1$ and $16_2$ interposed therebetween. They are stacked, for example, in the stack order of the hole transfer layers $14_1$ and $14_2$, the organic emission layers $16_1$ and $16_2$, and the electron transfer layers $18_1$ and $18_2$, or in the stack order of the electron transfer layers $18_1$ and $18_2$, the organic emission layers $16_1$ and $16_2$, and the hole transfer layers $14_1$ and $14_2$ in the direction from the first electrode layer 12 to the second electrode layer 20. In other words, the stack order may be properly selected depending on a polarity of a bias voltage applied between the first electrode layer 12 and the second electrode layer 20.

Specifically, as shown in FIG. 37, the organic EL device 2 according to the second modification of the third embodiment includes the substrate 10 and the first electrode layer 12 formed on the substrate 10, which transmit light. The organic EL device 2 further includes the first emission unit $40_1$, which is stacked on the first electrode layer 12 and includes the first hole transfer layer $14_1$, the first electron transfer layer $18_1$ and the first organic emission layers $16_1$ interposed therebetween in the direction from the first electrode layer 12 to the second electrode layer 20. In addition, the second emission unit $40_2$ includes the second hole transfer layer $14_2$, the second electron transfer layer $18_2$ and the second organic emission layers $16_2$ interposed therebetween in the direction from the first electrode layer 12 to the second electrode layer 20. The charge generating layer 22 is interposed between the first emission unit $40_1$ and the second emission unit $40_2$. The second electrode layer 20 transmitting light is formed on the emission unit $40_2$ and is formed on the top in the stack direction. In this modification, a distribution characteristic of light emitted from the first electrode layer 12 into the substrate 10 and a distribution characteristic of light emitted from the second electrode layer 20 have a luminance in a direction of a first angle $\theta_1$ of 20 to 50 degrees measured with respect to an axis perpendicular to the substrate 10 that is relatively high as compared to luminance in other angular directions. In addition, luminance in a direction of a second angle $\theta_2$ of 20 to 50 degrees measured with respect to an axis perpendicular to the second electrode layer 20 is relatively high as compared to luminance in other angular directions. Accordingly, in the organic EL device 2 according to the second modification of the third embodiment, the characteristic of the light distribution J in the substrate is maximized in its total amount of light (total light flux) and the characteristic of the distribution J of light emitted from the second electrode layer 20 is maximized in its total amount of light (total light flux). In this modification, the light emitted from the second electrode layer 20 propagates through, for example, an external air layer, etc.

As shown in FIG. 37, the organic EL device 2 according to the second modification of the third embodiment has a randomly uneven surface 42 which is formed on a rear surface in the opposite side to a front surface, on which the first electrode layer 12 of the substrate 10 is formed.

In the organic EL device 2 according to the second modification of the third embodiment, by providing the randomly uneven surface 42 on the emission surface of the substrate 10, it is possible to extract light with the first angle $\theta_1$ measured with respect to an axis perpendicular to the substrate 10 larger than light with the total internal refection angle. Other configurations in this modification are the same as those in the third embodiment.

<Third Modification>

Figure 38:
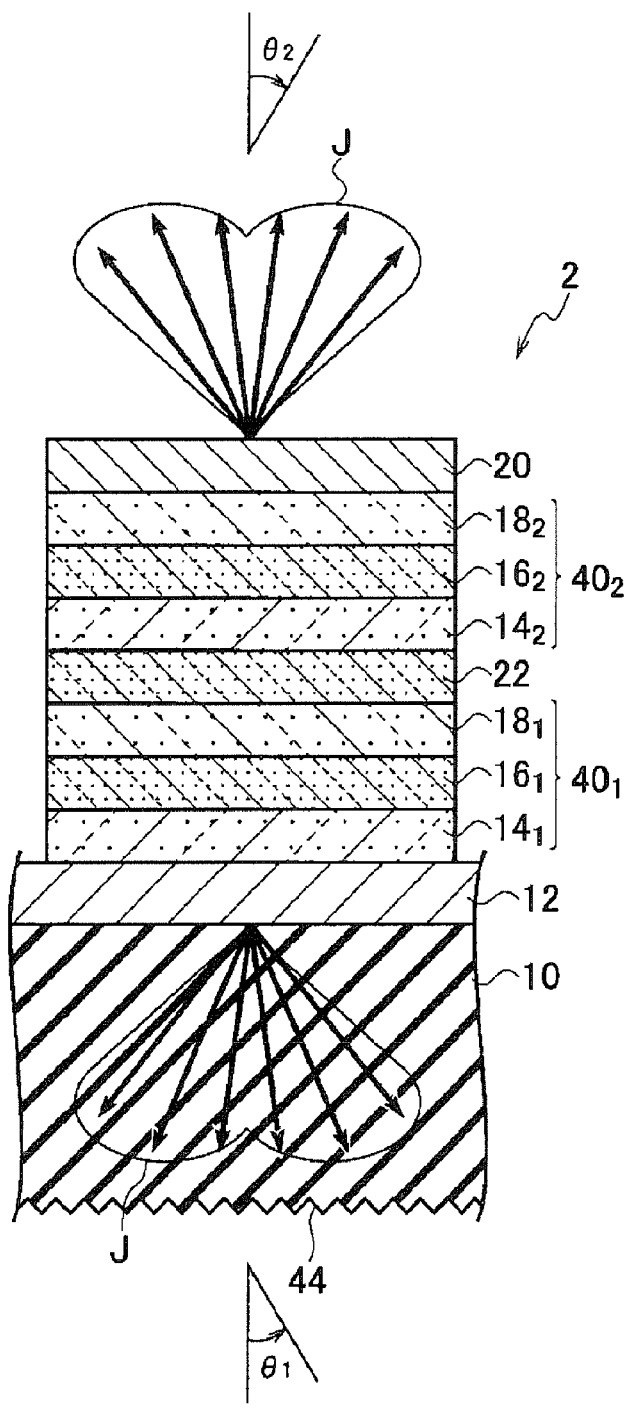
FIG. 38 is a schematic sectional view of an organic EL device according to a third modification of the third embodiment.

As shown in FIG. 38, an organic EL device 2 according to a third modification of the third embodiment has uneven surface 44. The uneven surface 44 is patterned into a predetermined pattern structure on a rear surface in the opposite side to a front surface on which the first electrode layer 12 of the substrate 10 is formed.

In this modification, the predetermined pattern structure may include, for example, a circular pattern, a triangle-based circular pattern, a square pattern, a rectangular pattern and the like.

In the organic EL device 2 according to the third modification of the third embodiment, by providing the uneven surface 44 patterned into the predetermined pattern structure, it is possible to extract light with the first angle $\theta_1$ measured with respect to an axis perpendicular to the substrate 10 larger than light with the total internal refection angle.

The organic EL device 2 according to the third modification of the third embodiment may have a film having a randomly uneven portion. The film is formed on its emission side on a rear surface in the opposite side to a front surface on which the first electrode layer 12 of the substrate 10 is formed.

Also in the organic EL device 2 according to the third modification of the third embodiment, a distribution characteristic of light emitted from the first electrode layer 12 into the substrate 10 and a distribution characteristic of light emitted from the second electrode layer 20 have a luminance in a direction of a first angle $\theta_1$ of 20 to 50 degrees measured with respect to an axis perpendicular to the substrate 10 that is relatively high as compared to luminance in other angular directions. In addition, luminance in a direction of a second angle $\theta_2$ of 20 to 50 degrees measured with respect to an axis perpendicular to the second electrode layer 20 is relatively high as compared to luminance in other angular directions. Accordingly, also in the organic EL device 2 according to the third modification of the third embodiment, the characteristic of the light distribution J in the substrate is maximized in its total amount of light (total light flux) and the characteristic of the distribution J of light emitted from the second electrode layer 20 is maximized in its total amount of light (total light flux). In this modification, the light emitted from the second electrode layer 20 propagates through, for example, an external air layer, etc. Other configurations in this modification are the same as those in the first embodiment.

<Fourth Modification>

Figure 39:
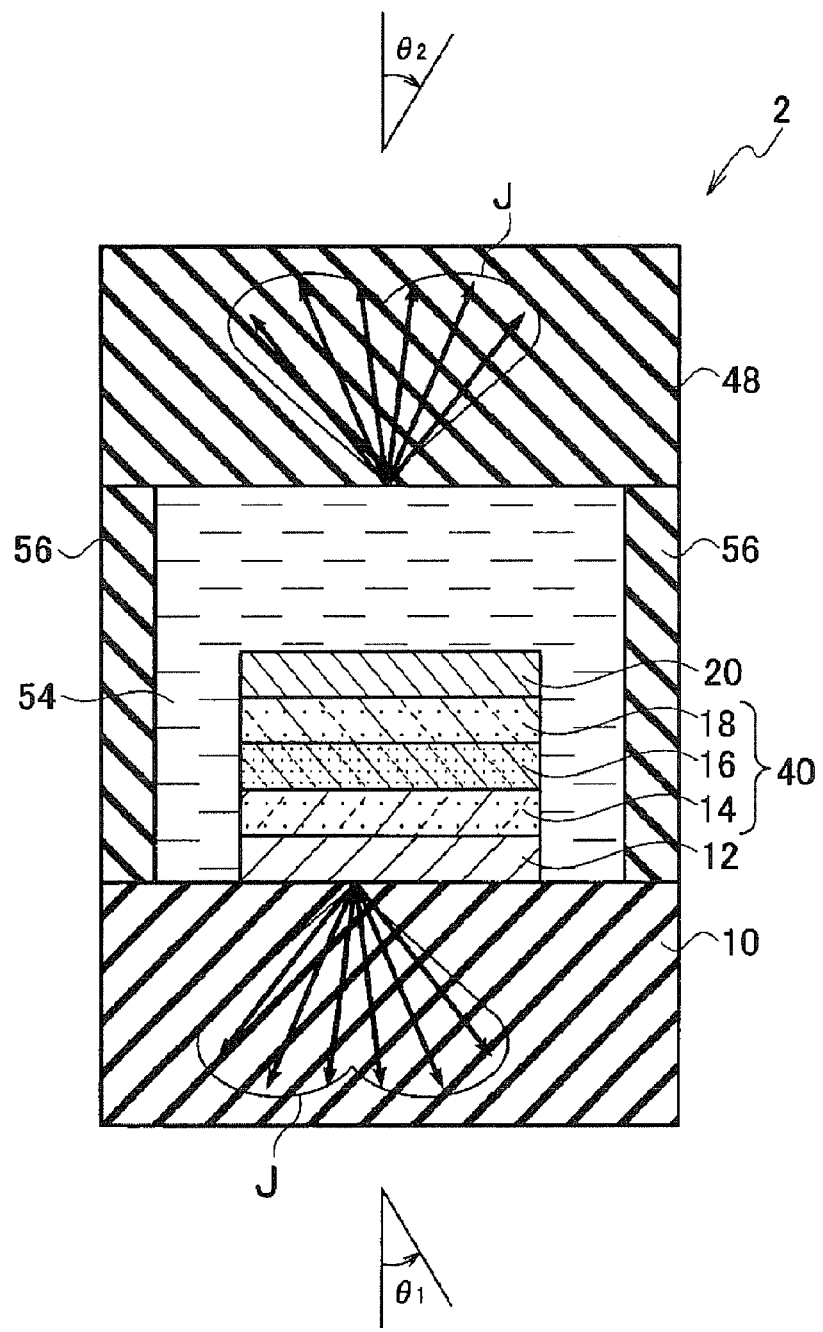
FIG. 39 is a schematic sectional view of an organic EL device according to a fourth modification of the third embodiment.

As shown in FIG. 39, an organic EL device 2 according to a fourth modification of the third embodiment includes a sealing member 56 formed on the substrate 10 transmitting light, a sealing plate 48 formed on the sealing member 56, and a filler 54 filling a gap between the sealing member 56 and the sealing plate 48, and between the organic EL layer 40, the first electrode layer 12 and the second electrode layer 20. In this modification, the organic EL layer 40, the first electrode layer 12 and the second electrode layer 20 are sealed by the sealing member 56 and the sealing plate 48. In addition, a distribution characteristic of light emitted from the first electrode layer 12 into the substrate 10 and a distribution characteristic of light emitted from the second electrode layer 20 into the sealing plate 48 have a luminance in a direction of a first angle $\theta_1$ of 20 to 50 degrees measured with respect to an axis perpendicular to the substrate 10 that is relatively high as compared to luminance in other angular directions, and a luminance in a direction of a second angle $\theta_2$ of 20 to 50 degrees measured with respect to an axis perpendicular to the second electrode layer 20 that is relatively high as compared to luminance in other angular directions.

The filler 54 may be made of solid or liquid resin, glass, fluoro-based oil or gel, or rare gas. The filler 54 may be transparent.

The sealing member 56 may be made of UV curable resin, glass fit, etc.

The sealing plate 48 may be formed of a polymer resin substrate, a glass substrate, etc.

A surface of the sealing plate 48 may include a random or regular unevenness structure.

A surface of the sealing plate 48 may include a light extraction film having random or regular unevenness.

Although it is shown in FIG. 39 that the sealing member 56 is directly formed on the substrate 10, the sealing member 56 may be formed on the first electrode layer 12, which is placed on the substrate 10. For example, the first electrode layer 12 may be formed on the substrate 10 and the sealing member 56 may be formed on the first electrode layer 12 through a patterning process. Other configurations in this modification are the same as those in the third embodiment.

<Fifth Modification>

Figure 40:
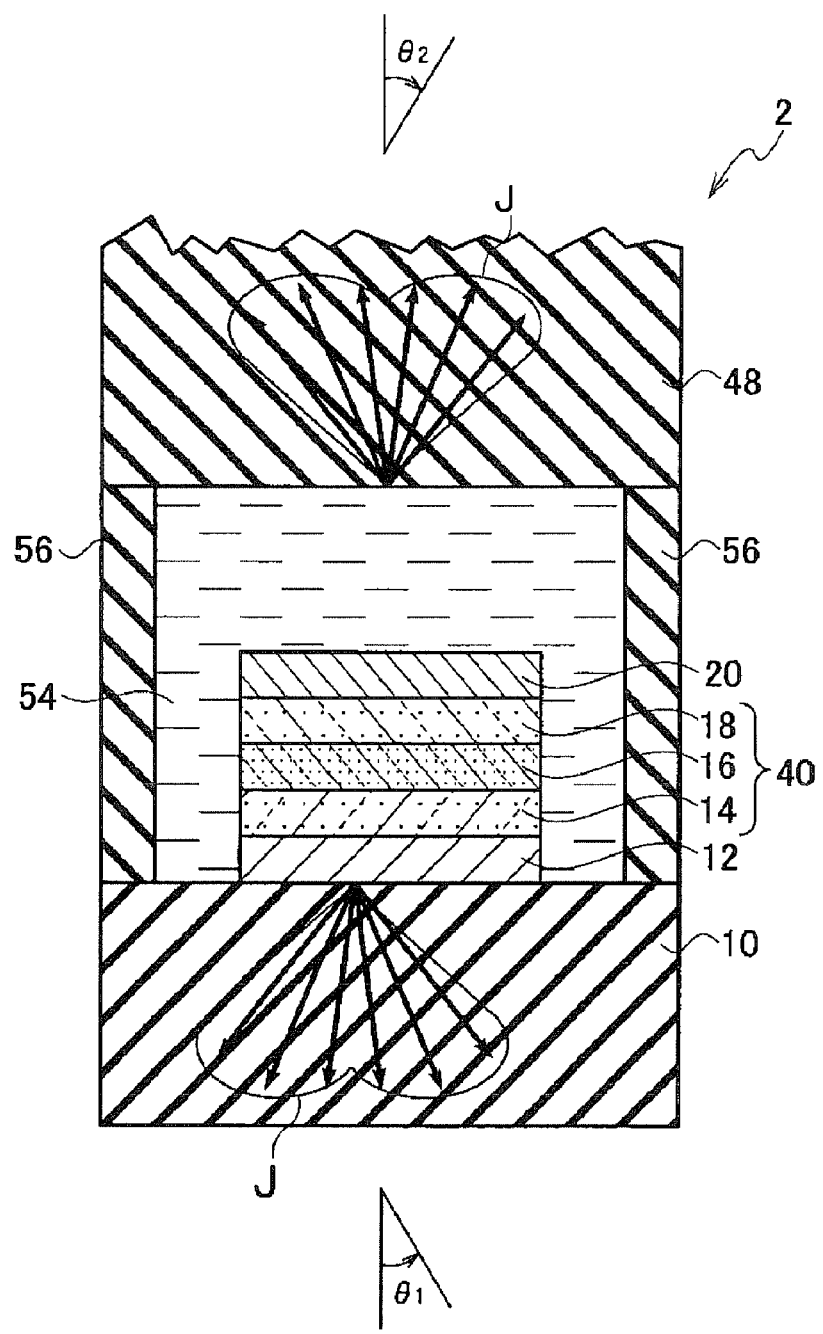
FIG. 40 is a schematic sectional view of an organic EL device according to a fifth modification of the third embodiment.

As shown in FIG. 40, an organic EL device 2 according to a fifth modification of the third embodiment includes a randomly uneven structure provided on a surface of the sealing plate 48.

In the organic EL device 2 according to the fifth modification of the third embodiment, by providing the randomly uneven surface on an emission surface of the sealing plate 48, it is possible to extract light with the second angle $\theta_2$ measured with respect to an axis perpendicular to the second electrode layer 20 larger than light with the total internal refection angle. That is, by providing unevenness for the emission surface of the sealing plate 48, original light components of total reflection can be also extracted out of the sealing plate 48, thereby improving final emission efficiency. Other configurations in this modification are the same as those in the third embodiment.

<Sixth Modification>

Figure 41:
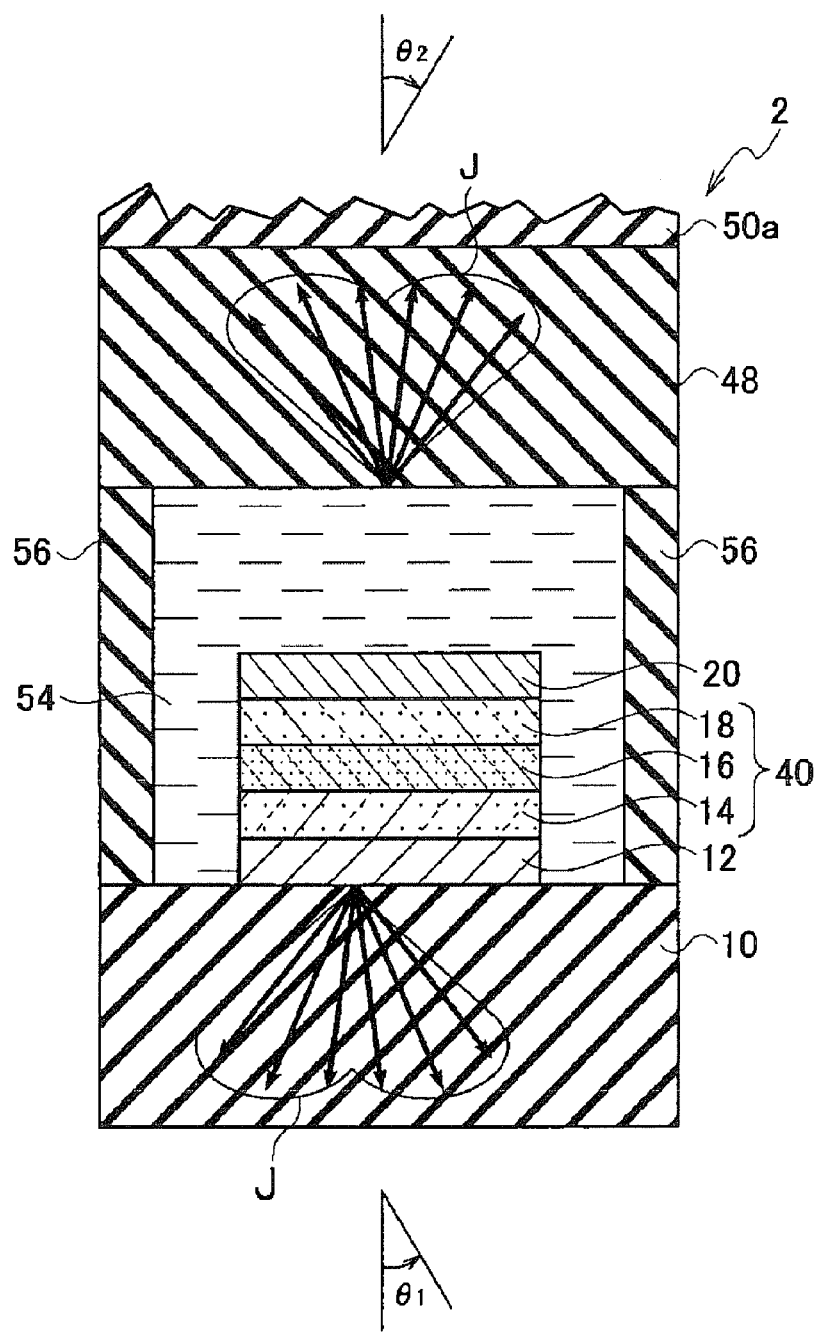
FIG. 41 is a schematic sectional view of an organic EL device according to a sixth modification of the third embodiment.

As shown in FIG. 41, an organic EL device 2 according to a sixth modification of the third embodiment includes a light extraction film 50a having random unevenness provided on the surface of the sealing plate 48. The light extraction film 50a may be formed of, for example, a prism sheet, etc. Other configurations in this modification are the same as those in the third embodiment.

<Seventh Modification>

Figure 42:
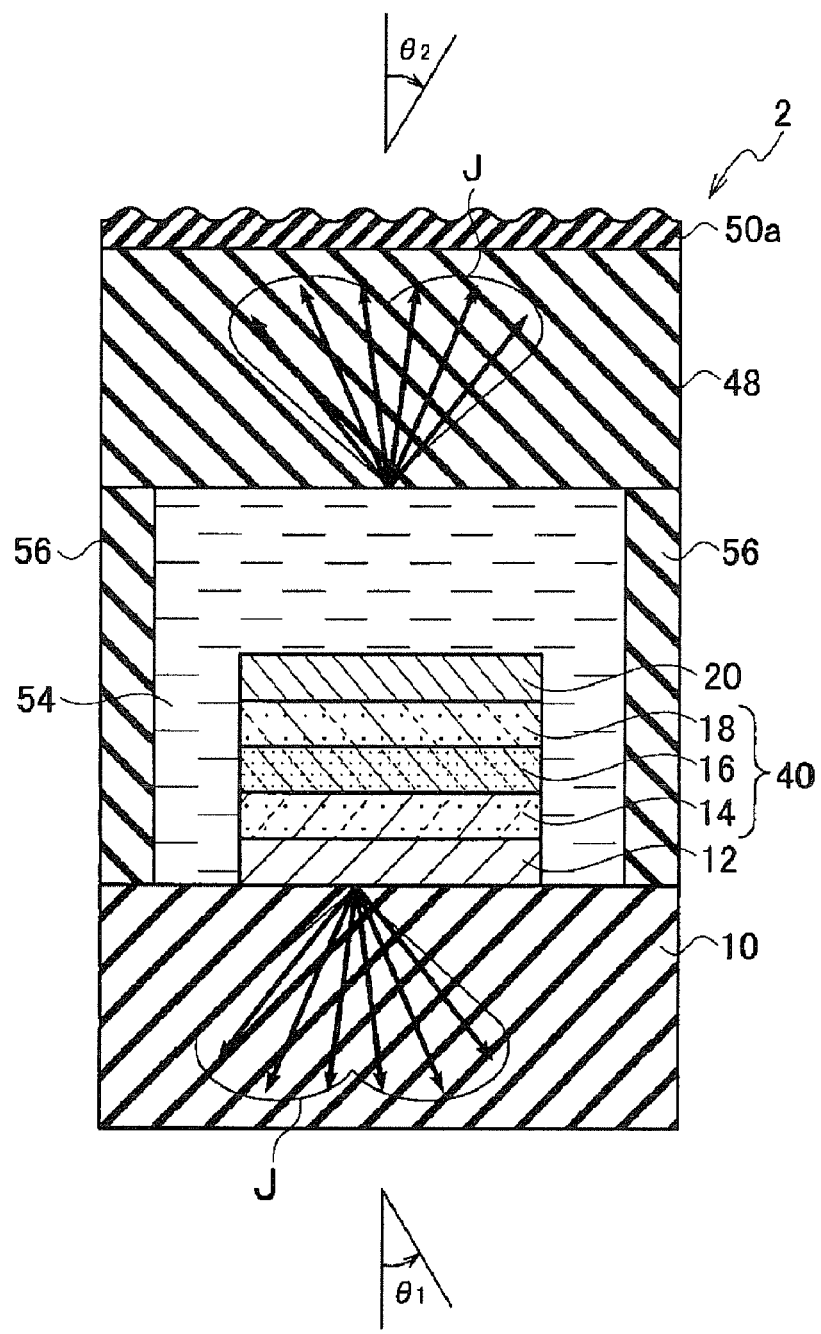
FIG. 42 is a schematic sectional view of an organic EL device according to a seventh modification of the third embodiment.

As shown in FIG. 42, an organic EL device 2 according to a seventh modification of the third embodiment includes a light extraction film 50a having regular unevenness formed on the surface of the sealing plate 48. Other configurations in this modification are the same as those in the third embodiment.

<Eighth Modification>

Figure 43:
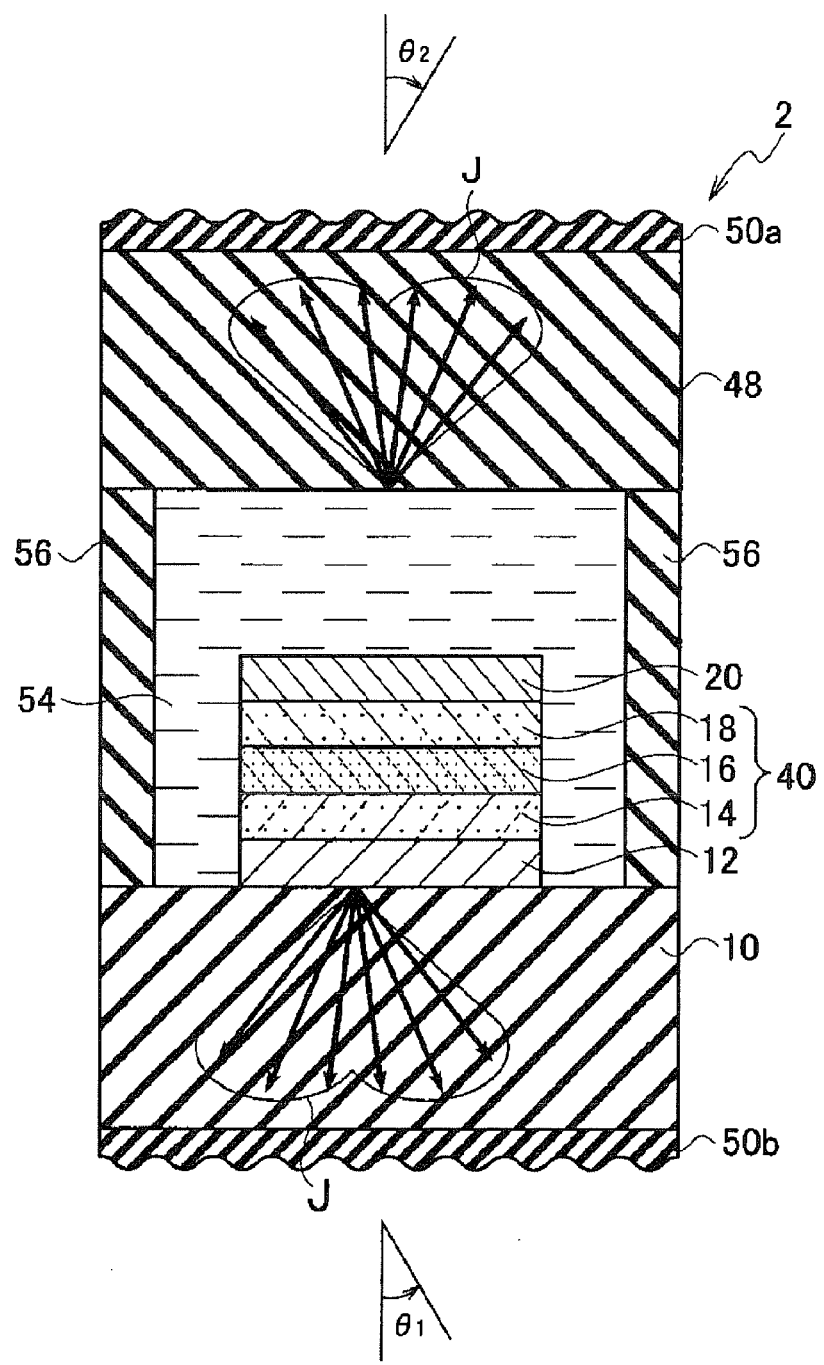
FIG. 43 is a schematic sectional view of an organic EL device according to an eighth modification of the third embodiment.

As shown in FIG. 43, an organic EL device 2 according to an eighth modification of the third embodiment includes a light extraction film 50b having regular unevenness formed on a rear surface of the substrate 10. The light extraction film 50b may be formed of, for example, a prism sheet, etc.

In the organic EL device 2 according to the eighth modification of the third embodiment, by providing the light extraction film 50b having the regular unevenness on the rear surface of the substrate 10, it is possible to extract light with the first angle $\theta_1$ measured with respect to an axis perpendicular to the substrate 10 larger than light with the total internal refection angle. That is, by providing unevenness for the emission surface of the substrate 10, original light components of total reflection can be also extracted out of the substrate 10, thereby improving final emission efficiency. Other configurations in this modification are the same as those in the third embodiment.

<Ninth Modification>

Figure 44:
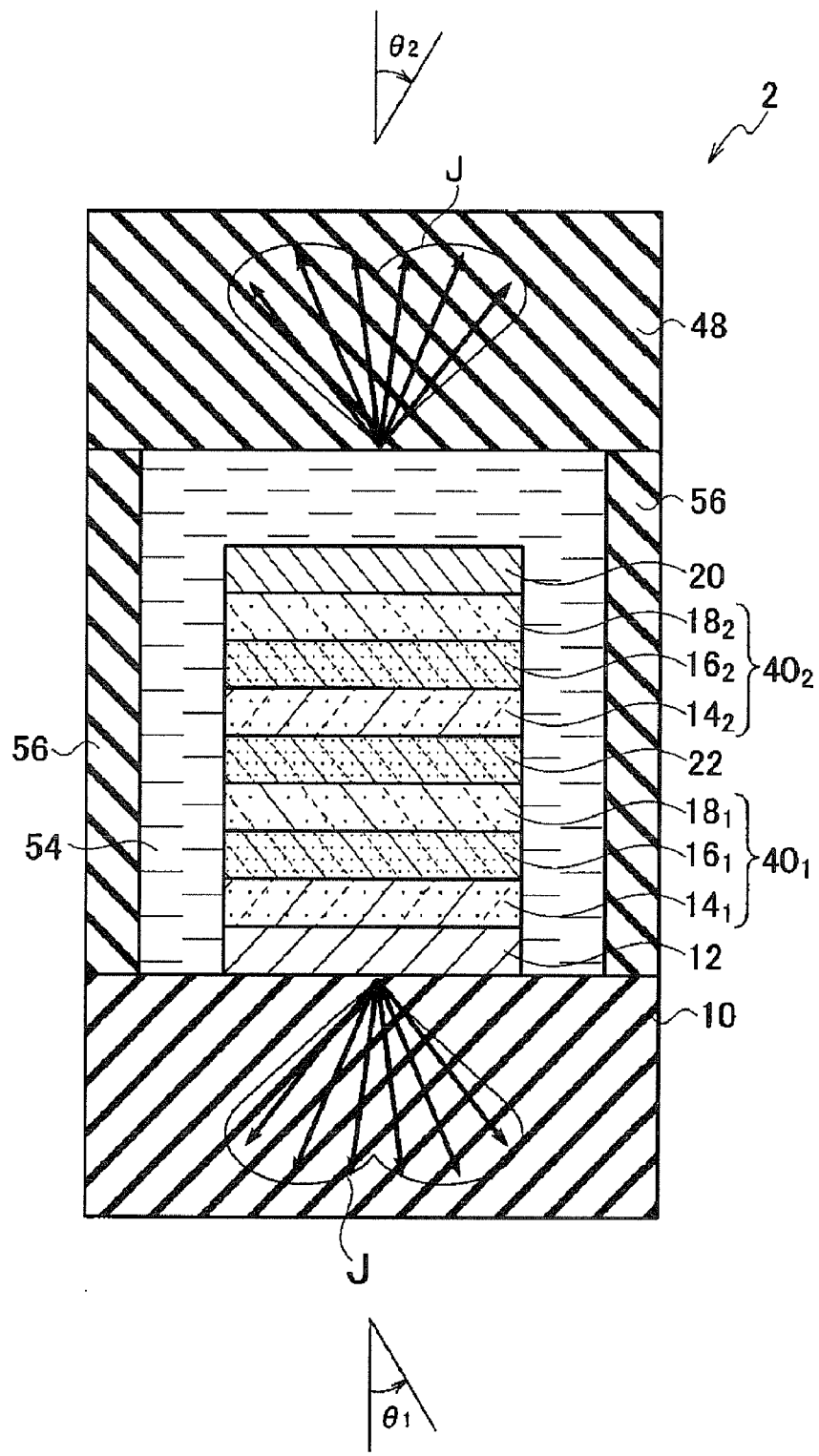
FIG. 44 is a schematic sectional view of an organic EL device according to a ninth modification of the third embodiment.

As shown in FIG. 44, an organic EL device 2 according to a ninth modification of the third embodiment has a MPE type structure including the organic EL layer containing two or more organic emission layers and one or more charge generating layers.

As shown in FIG. 44, the organic EL device 2 according to the ninth modification of the third embodiment includes a sealing member 56 formed on the substrate 10 transmitting light, a sealing plate 48 formed on the sealing member 56, and a filler 54 filling a gap between the sealing member 56 and the sealing plate 48, and between the organic EL layer 40, the first electrode layer 12 and the second electrode layer 20. In this modification, the organic EL layer 40, the first electrode layer 12 and the second electrode layer 20 are sealed by the sealing member 56 and the sealing plate 48. In addition, a distribution characteristic of light emitted from the first electrode layer 12 into the substrate 10 and a distribution characteristic of light emitted from the second electrode layer 20 into the sealing plate 48 have a luminance in a direction of a first angle $\theta_1$ of 20 to 50 degrees measured with respect to an axis perpendicular to the substrate 10 that is relatively high as compared to luminance in other angular directions. Further, luminance in a direction of a second angle $\theta_2$ of 20 to 50 degrees measured with respect to an axis perpendicular to the second electrode layer 20 is relatively high as compared to luminance in other angular directions.

The filler 54 may be made of solid or liquid resin, glass, fluoro-based oil or gel, or rare gas. The filler 54 may be transparent.

The sealing member 56 may be made of UV curable resin, glass fit, etc.

The sealing plate 48 may be formed of a polymer resin substrate, a glass substrate, etc.

A surface of the sealing plate 48 may include a random or regular unevenness structure.

A surface of the sealing plate 48 may include a light extraction film having random or regular unevenness.

Although it is shown in FIG. 44 that the sealing member 56 is directly formed on the substrate 10, the sealing member 56 may be formed on the first electrode layer 12, which is formed on the substrate 10. For example, the first electrode layer 12 may be formed on the substrate 10 and the sealing member 56 may be formed on a portion of the first electrode layer 12 through a patterning process. Other configurations in this modification are the same as those in the second modification of the third embodiment.

<Tenth Modification>

Figure 45:
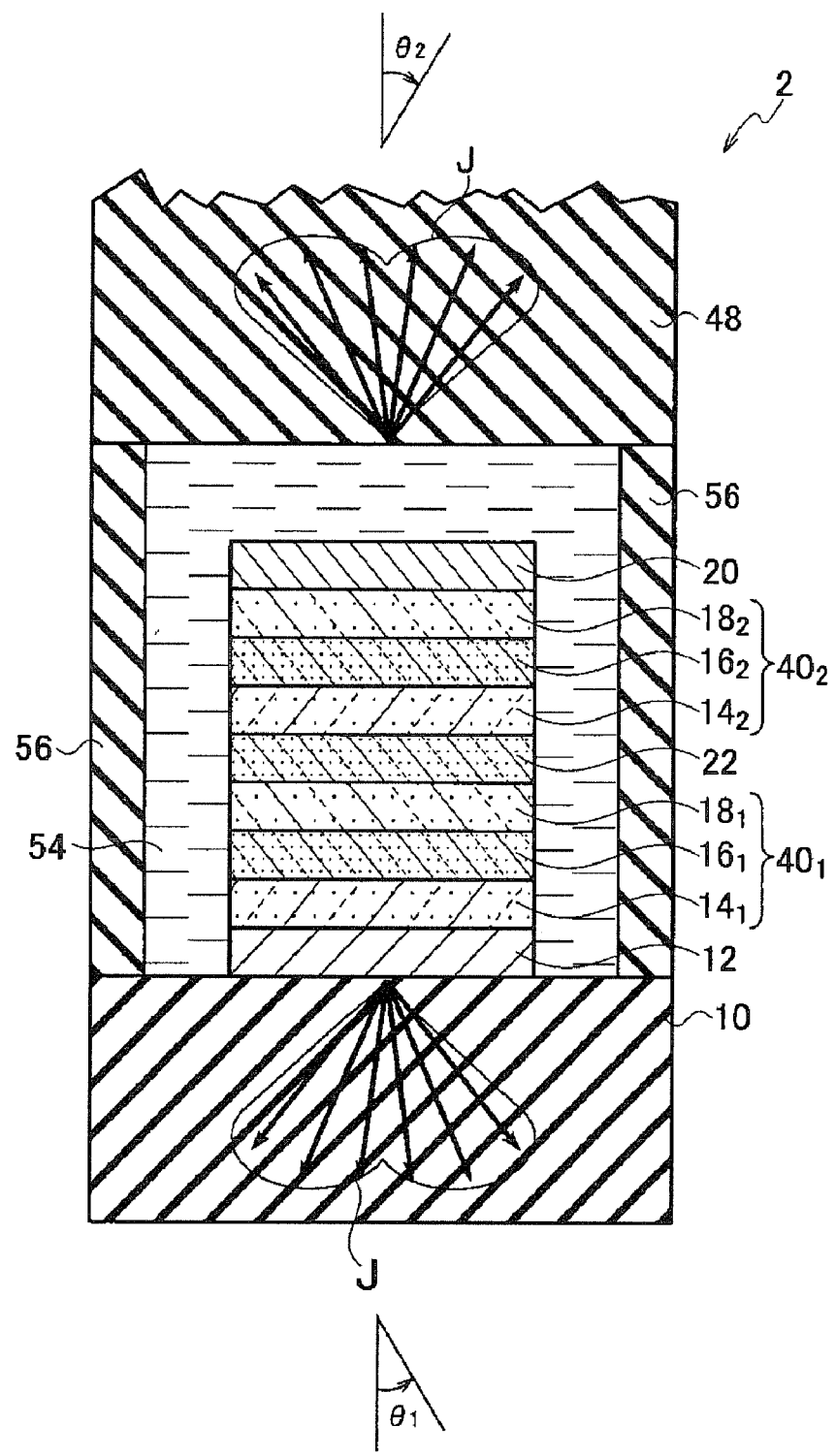
FIG. 45 is a schematic sectional view of an organic EL device according to a tenth modification of the third embodiment.

As shown in FIG. 45, an organic EL device 2 according to a tenth modification of the third embodiment includes a randomly uneven structure formed on a surface of the sealing plate 48.

In the organic EL device 2 according to the tenth modification of the third embodiment, by forming the randomly uneven surface on an emission surface of the sealing plate 48, it is possible to extract light with the second angle $\theta_2$ measured with respect to an axis perpendicular to the second electrode layer 20 larger than light with the total internal refection angle. That is, by providing unevenness for the emission surface of the sealing plate 48, original light components of total reflection can be also extracted out of the sealing plate 48, thereby improving final emission efficiency. Other configurations in this modification are the same as those in the second modification of the third embodiment.

<Eleventh Modification>

Figure 46:
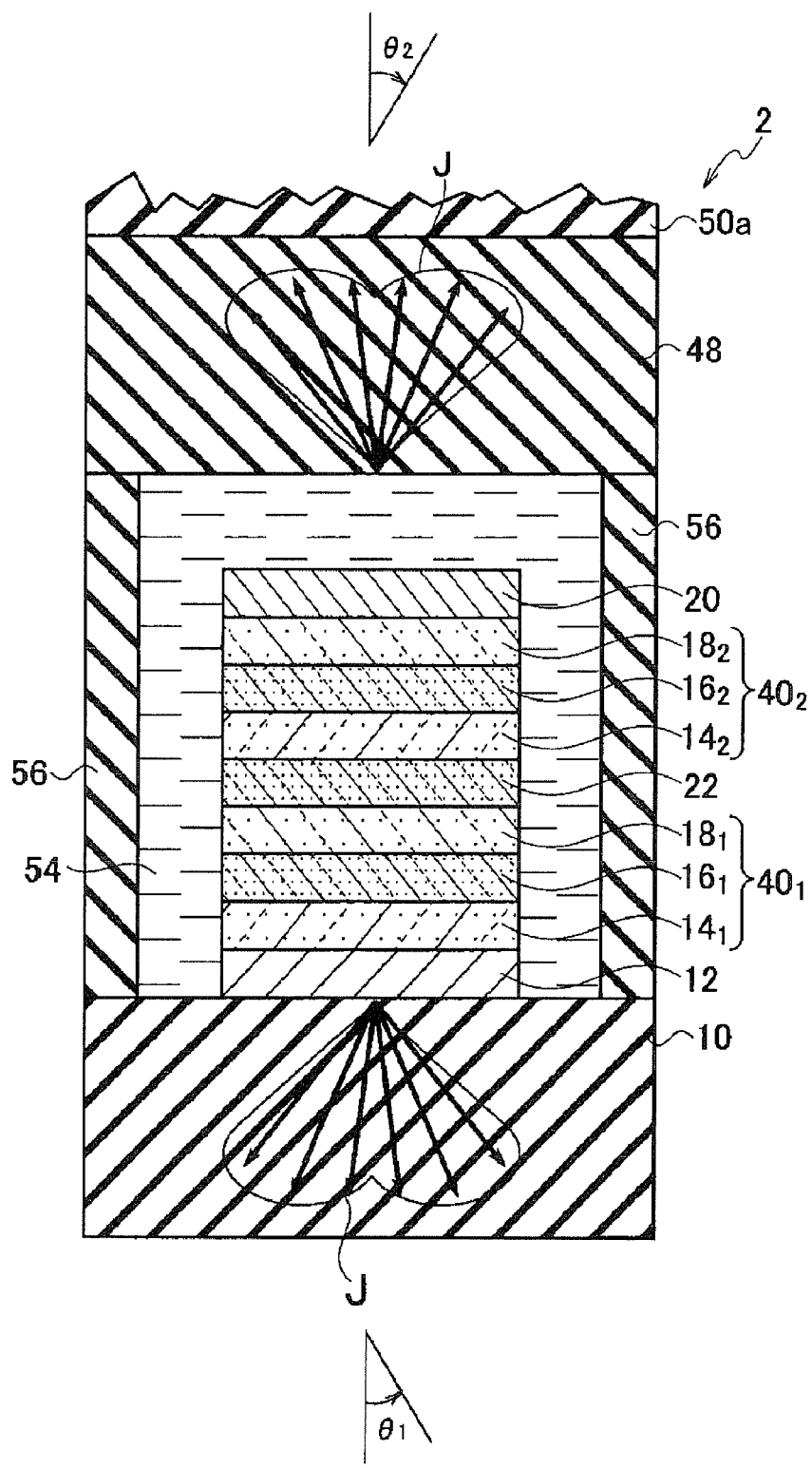
FIG. 46 is a schematic sectional view of an organic EL device according to an eleventh modification of the third embodiment.

As shown in FIG. 46, an organic EL device 2 according to an eleventh modification of the third embodiment includes a light extraction film 50a having random unevenness formed on the surface of the sealing plate 48. The light extraction film 50a may be formed of, for example, a prism sheet, etc. Other configurations in this modification are the same as those in the second modification of the third embodiment.

<Twelfth Modification>

Figure 47:
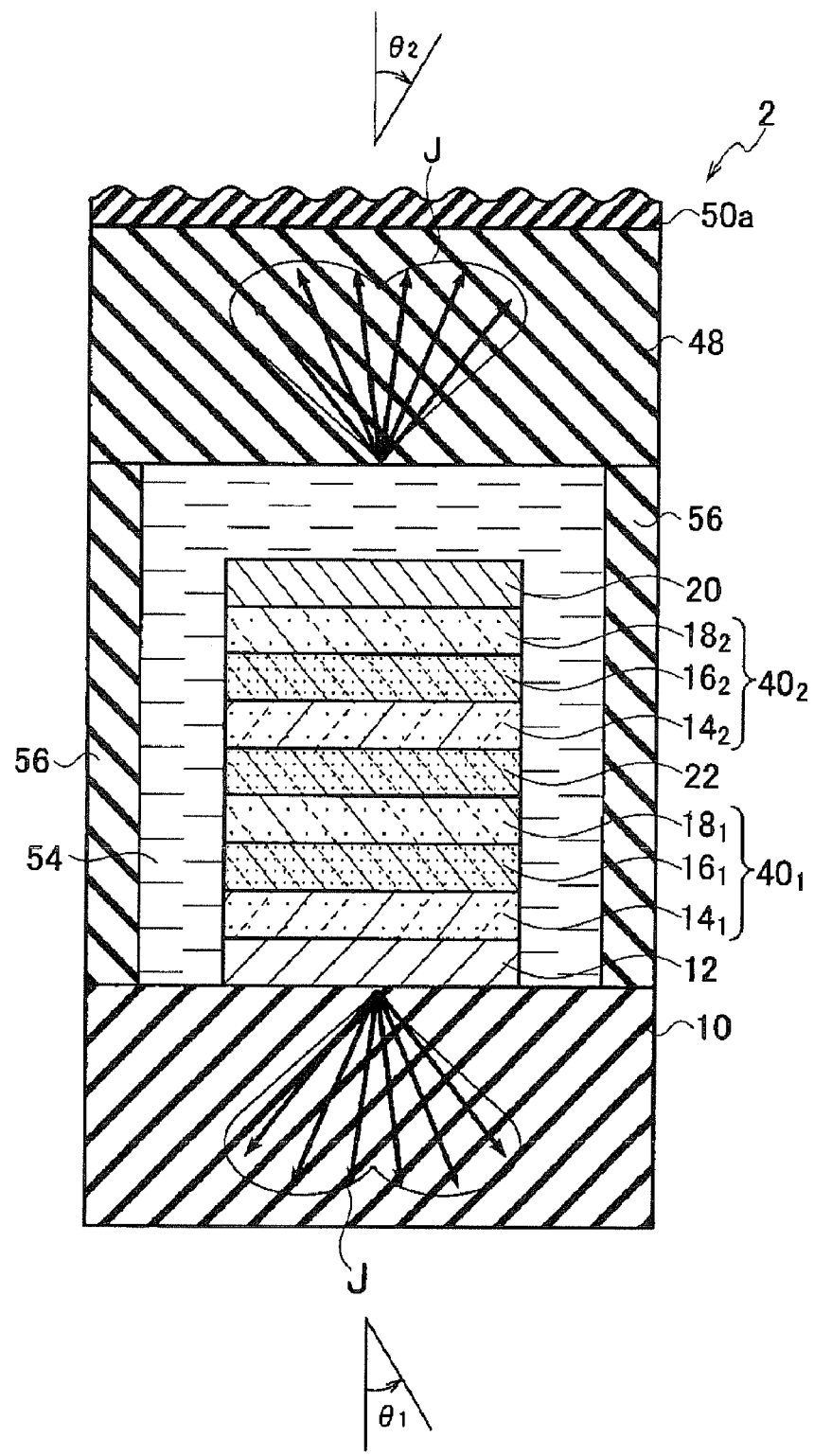
FIG. 47 is a schematic sectional view of an organic EL device according to a twelfth modification of the third embodiment.

As shown in FIG. 47, an organic EL device 2 according to a twelfth modification of the third embodiment includes a light extraction film 50a having regular unevenness formed on the surface of the sealing plate 48. Other configurations in this modification are the same as those in the second modification of the third embodiment.

<Thirteenth Modification>

Figure 48:
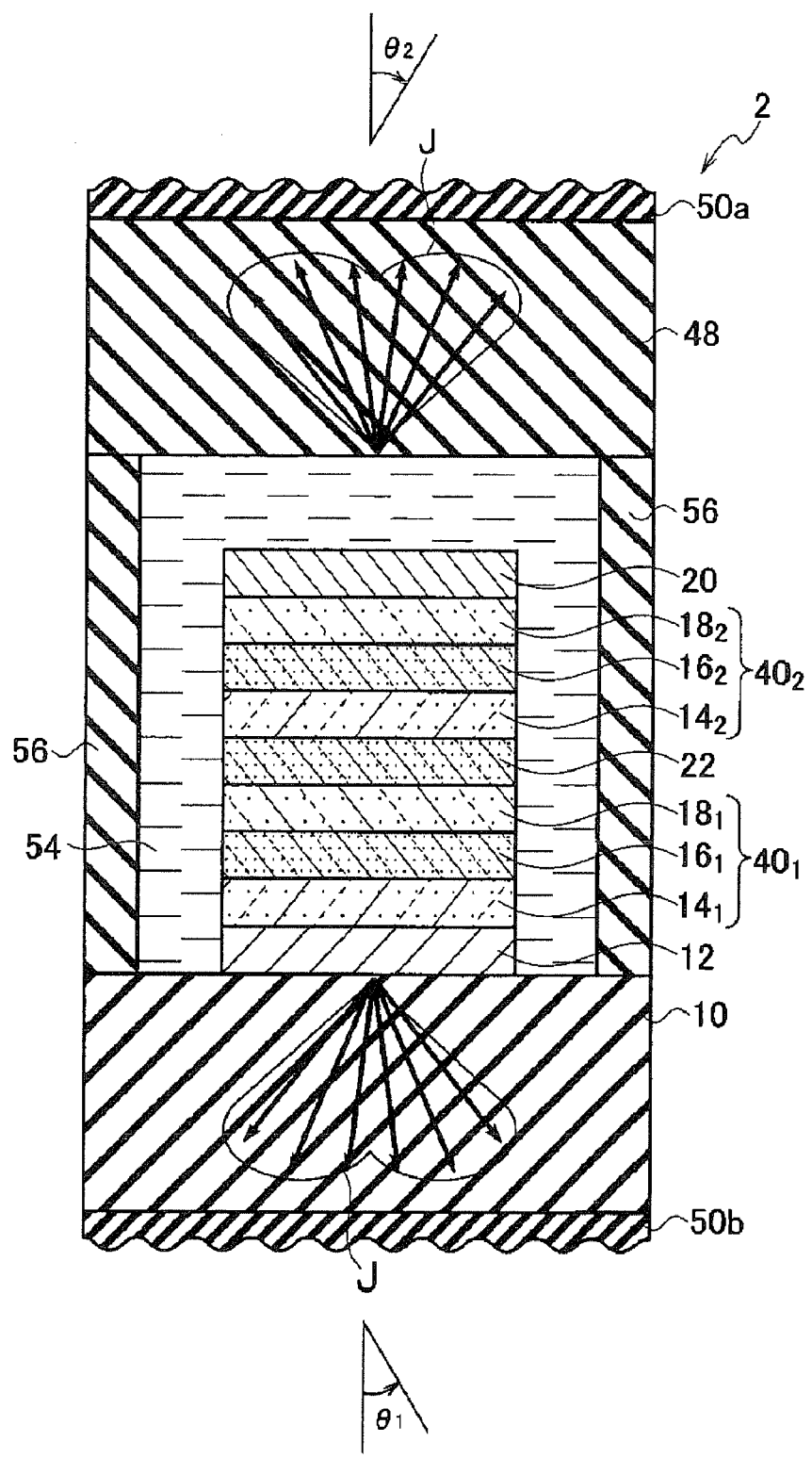
FIG. 48 is a schematic sectional view of an organic EL device according to a thirteenth modification of the third embodiment.

As shown in FIG. 48, an organic EL device 2 according to a thirteenth modification of the third embodiment includes a light extraction film 50b having regular unevenness formed on a rear surface of the substrate 10. The light extraction film 50b may be formed of, for example, a prism sheet, etc.

In the organic EL device 2 according to the thirteenth modification of the third embodiment, by providing the light extraction film 50b having the regular unevenness on the rear surface of the substrate 10, it is possible to extract light with the first angle $\theta_1$ measured with respect to an axis perpendicular to the substrate 10 larger than light with the total internal refection angle. That is, by providing unevenness for the emission surface of the substrate 10, original light components of total reflection can be also extracted out of the substrate 10, thereby improving final emission efficiency. Other configurations in this modification are the same as those in the second modification of the third embodiment.

According to the third embodiment and the first to thirteenth modifications thereof, it is possible to provide a bottom and top emission organic EL device with a light distribution controlled to improve an efficiency of light extraction.

As described above, the present disclosure can provide an organic EL device with a light distribution controlled to improve an efficiency of light extraction.

<Other Embodiments>

Although the first to third embodiments of the present disclosure and the modifications thereof have been shown and described in the above, it should be understood that the description and the drawings which constitutes a part of the present disclosure do not limit the spirit of the present disclosure. Various alternative embodiments and operation techniques of the present disclosure are apparent to those skilled in the art.

In the organic EL devices of the embodiments, the organic emission layer may include a double emission layer. For example, a blue (B) emission layer and a red (R) emission layer, or a blue (B) emission layer and a green (G) emission layer, or a green (G) emission layer and a red (R) emission layer may be stacked in the same emission unit. In addition, the organic emission layer may include an emission layer where red emission material and a green emission material are mixed.

For example, the organic emission layer may employ a hybrid system where fluorescent material is used for the blue (B) emission layer and phosphorescent material is used for the green (G) emission layer and the red (R) emission layer.

An internal quantum efficiency per emission unit has an upper limit of 100% (about 25% for fluorescent material). If a plurality of colors is set to emit in one emission unit, the internal quantum efficiency is distributed for the plurality of the different colors. Therefore, in the hybrid system where fluorescent material is used for the blue (B) emission layer and phosphorescent material is used for the green (G) emission layer and the red (R) emission layer, it is not advisable to combine the blue (B) emission layer and a different color emission layer in one emission unit. It is most suitable for the hybrid system to use the blue (B) emission layer of the fluorescent material alone for one emission unit.

In addition, the phosphorescent material may be used for the blue (B) emission layer, in addition to the green (G) emission layer and the red (R) emission layer.

According to the present disclosure in some embodiments, it is possible to provide an organic EL device with a light distribution controlled to improve an efficiency of light extraction.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An organic EL device comprising:
   a substrate having an uneven surface and a front surface opposite the uneven surface;
   a first electrode layer formed on the front surface;
   an organic EL layer formed on the first electrode layer;
   a second electrode layer formed on the organic EL layer;
   a sealing member formed on the front surface of the substrate; and
   a sealing plate formed on the sealing member, the sealing plate being disposed over the second electrode layer and opposite from the substrate,
   wherein a first distribution characteristic of light emitted from the first and second electrode layers into the substrate has a first luminance in a direction of a first angle of 20 to 50 degrees measured with respect to an axis perpendicular to the substrate, the first luminance being relatively high as compared to other luminance of the light emitted into the substrate from the first and second electrode layers, and
   wherein a second distribution characteristic of light emitted from the first and second electrode layers into the sealing plate has a second luminance in a direction of a second angle of 20 to 50 degrees measured with respect to an axis perpendicular to the second electrode layer, the second luminance being relatively high as compared to other luminance of the light emitted into the sealing plate from the first and second electrode layers.

2. The organic EL device of claim 1, wherein the organic EL layer is a
   multiphoton emission type organic EL layer including one or more charge generating layers and two or more emission layers.

3. The organic EL device of claim 1, wherein an element front reflectivity average of the organic EL device is equal to or more than 70%.

4. The organic EL device of claim 1, wherein all of the uneven surface is free from any contact from each of the first electrode layer, the organic EL layer and the second electrode layer.

5. An organic EL device comprising:
   a substrate configured to transmit light and having an uneven surface and a front surface opposite the uneven surface;
   a first electrode layer configured to transmit light, the first electrode layer being formed on the front surface;
   a plurality of emission units stacked on the first electrode layer, the plurality of emission units including a hole transfer layer, an electron transfer layer and an organic emission layer interposed between the hole transfer layer and the electron transfer layer;
   a second electrode layer formed on one of the emission units disposed on a top in a stack direction of the plurality of emission units;
   a charge generating layer interposed between the emission units;
   a sealing member formed on the front surface of the substrate; and
   a sealing plate formed on the sealing member, the sealing plate being disposed over the second electrode layer and opposite from the substrate,
   wherein a first distribution characteristic of light emitted from the first and second electrode layers into the substrate has a first luminance in a direction of a first angle of 20 to 50 degrees measured with respect to an axis perpendicular to the substrate, the first luminance being relatively high as compared to other luminance of the light emitted into the substrate from the first and second electrode layers, and
   wherein a second distribution characteristic of light emitted from the first and second electrode layers into the sealing plate has a second luminance in a direction of a second angle of 20 to 50 degrees measured with respect to an axis perpendicular to the second electrode layer, the second luminance being relatively high as compared to other luminance of the light emitted into the sealing plate from the first and second electrode layers.

6. The organic EL device of claim 5, wherein all of the uneven surface is free from any contact from each of the first electrode layer, the emission units, the charge generating layer and the second electrode layer.

7. An organic EL device comprising:
   a substrate configured to transmit light and having an uneven surface and a front surface opposite the uneven surface;
   a first electrode layer configured to transmit light, the first electrode layer being formed on the front surface;
   a first emission unit stacked on the first electrode layer, the first emission unit including a first hole transfer layer, a first electron transfer layer and a first organic emission layer interposed between the first hole transfer layer and the first electron transfer layer;
   a second emission unit stacked on the first emission unit, the second emission unit including a second hole transfer layer, a second electron transfer layer and a second organic emission layer interposed between the second hole transfer layer and the second electron transfer layer;
   a charge generating layer interposed between the first emission unit and the second emission unit;
   a second electrode layer, formed on the second emission unit, that is disposed on a top in a stack direction;
   a sealing member formed on the front surface of the substrate; and
   a sealing plate formed on the sealing member, the sealing plate being disposed over the second electrode layer and opposite from the substrate,
   wherein a first distribution characteristic of light emitted from the first and second electrode layers into the substrate has a first luminance in a direction of a first angle of 20 to 50 degrees measured with respect to an axis perpendicular to the substrate, the first luminance being relatively high as compared to other luminance of the light emitted into the substrate from the first and second electrode layers, and wherein a second distribution characteristic of light emitted from the first and second electrode layers into the sealing plate has a second luminance in a direction of a second angle of 20 to 50 degrees measured with respect to an axis perpendicular to the second electrode layer, the second luminance being relatively high as compared to other luminance of the light emitted into the sealing plate from the first and second electrode layers.

8. The organic EL device of claim 7, wherein all of the uneven surface is free from any contact from each of the first electrode layer, the first and second emission units, the charge generating layer and the second electrode layer.

9. An organic EL device comprising:
a substrate;
a first electrode layer formed on the substrate;
an organic EL layer formed on the first electrode layer;
a second electrode layer formed on the organic EL layer;
a sealing member formed on the substrate; and
a sealing plate formed on the sealing member, and including an uneven portion as a surface of the sealing plate, the sealing plate being disposed over the second electrode layer and opposite from the substrate,
wherein a distribution characteristic of light emitted into the sealing plate from the second electrode layer has a luminance in a direction of a second angle of 20 to 50 degrees measured with respect to an axis perpendicular to the second electrode layer, the luminance being relatively high as compared to other luminance of the light emitted into the sealing plate from the second electrode layer,
wherein the uneven portion is patterned into a predetermined pattern structure,
in a plan view, the pattern structure is comprised of circles, and the circles form a triangle-based pattern, the circles being spaced apart from each other at a predetermined interval so that each of the circles is free of any contact from all others of the circles, and
in a cross-sectional view, the uneven portion is comprised of a triangular structure or a semi-circular structure.

10. The organic EL device of claim 9, further comprising:
a filler configured to fill a gap between the sealing member and the sealing plate, and between the organic EL layer, the first electrode layer and the second electrode layer,
wherein the organic EL layer, the first electrode layer and the second electrode layer are sealed by the sealing member and the sealing plate.

11. The organic EL device of claim 10, wherein the filler includes solid or liquid resin, glass, oil or gel, or rare gas.

12. The organic EL device of claim 9, wherein all of the uneven portion is free from any contact from each of the substrate, the first electrode layer and the second electrode layer.

13. An organic EL device comprising:
a substrate;
a first electrode layer formed on the substrate;
a plurality of emission units stacked on the first electrode layer, the plurality of emission units including a hole transfer layer, an electron transfer layer and an organic emission layer interposed between the hole transfer layer and the electron transfer layer;
a second electrode layer formed on one of the emission units disposed on a top in a stack direction of the plurality of emission units;
a charge generating layer interposed between the emission units;
a sealing member formed on the substrate; and
a sealing plate formed on the sealing member, and including an uneven portion as a surface of the sealing plate, the sealing plate being disposed over the second electrode layer and opposite from the substrate,
wherein a distribution characteristic of light emitted into the sealing plate from the second electrode layer has a luminance in a direction of a second angle of 20 to 50 degrees measured with respect to an axis perpendicular to the second electrode layer, the luminance being relatively high as compared to other luminance of the light emitted into the sealing plate from the second electrode layer,
wherein the uneven portion is patterned into a predetermined pattern structure,
in a plan view, the pattern structure is comprised of circles, the circles being spaced apart from each other at a predetermined interval so that each of the circles is free of any contact from all others of the circles, and the circles form a triangle-based pattern, and
in a cross-sectional view, the uneven portion is comprised of a triangular structure or a semi-circular structure.

14. The organic EL device of claim 13, further comprising:
a filler configured to fill a gap between the sealing member and the sealing plate, and between the plurality of emission units, the charge generating layer, the first electrode layer and the second electrode layer,
wherein the plurality of emission units, the charge generating layer, the first electrode layer and the second electrode layer are sealed by the sealing member and the sealing plate.

15. The organic EL device of claim 14, wherein the filler includes solid or liquid resin, glass, oil or gel, or rare gas.

16. The organic EL device of claim 13, wherein all of the uneven portion is free from any contact from each of the emission units, the substrate, the first electrode layer and the second electrode layer.

17. An organic EL device comprising:
a substrate;
a first electrode layer formed on the substrate;
a first emission unit which is stacked on the first electrode layer and includes a first hole transfer layer, a first electron transfer layer and a first organic emission layer interposed between the first hole transfer layer and the first electron transfer layer;
a second emission unit which is stacked on the first emission unit and includes a second hole transfer layer, a second electron transfer layer and a second organic emission layer interposed between the second hole transfer layer and the second electron transfer layer;
a charge generating layer interposed between the first emission unit and the second emission unit;
a second electrode layer, formed on the second emission unit, disposed on a top in a stack direction;
a sealing member formed on the substrate; and
a sealing plate formed on the sealing member, and including an uneven portion as a surface of the sealing plate, the sealing plate being disposed over the second electrode layer and opposite from the substrate,
wherein a distribution characteristic of light emitted into the sealing plate from the second electrode layer has a luminance in a direction of a second angle of 20 to 50 degrees measured with respect to an axis perpendicular to the second electrode layer, the luminance being relatively high as compared to other luminance of the light emitted into the sealing plate from the second electrode layer, wherein the uneven portion is patterned into a predetermined pattern structure, in a plan view, the pattern structure is comprised of circles, the circles being spaced apart from each other at a predetermined interval so that each of the circles is free of any contact from all others of the circles, and the circles form a triangle-based pattern, and in a cross-sectional view, the uneven portion is comprised of a triangular structure or a semi-circular structure.

18. The organic EL device of claim 17, wherein all of the uneven portion is free from any contact from each of the first and second emission units, the substrate, the first electrode layer and the second electrode layer.

19. An organic EL device comprising:
a substrate configured to transmit light;
a first electrode layer formed on the substrate;
an organic EL layer formed on the first electrode layer;
a second electrode layer formed on the organic EL layer;
a sealing member formed on the substrate; and
a sealing plate formed on the sealing member,
wherein a distribution characteristic of light emitted from the first electrode layer into the substrate and a distribution characteristic of light emitted from the second electrode layer have a luminance in a direction of a first angle of 20 to 50 degrees measured with respect to an axis perpendicular to the substrate, the luminance being relatively high as compared to other luminance of the light emitted from the first and second electrode layers, and a luminance of the light emitted from the first and second electrode layers being in a direction of a second angle of 20 to 50 degrees measured with respect to an axis perpendicular to the second electrode layer, the luminance in the direction of the second angle being relatively high as compared to other luminance of the light emitted from the first and second electrode layers,
wherein one or more of a surface of the sealing plate and a surface of the substrate includes an uneven portion,
the uneven portion is patterned into a predetermined pattern structure,
in a plan view, the pattern structure is comprised of circles, the circles being spaced apart from each other at a predetermined interval so that each of the circles is free of any contact from all others of the circles, and the circles form a triangle-based pattern, and
in a cross-sectional view, the uneven portion is comprised of a triangular structure or a semi-circular structure.

20. The organic EL device of claim 19, further comprising:
a filler configured to fill a gap between the sealing member and the sealing plate,
and between the organic EL layer, the first electrode layer and the second electrode layer,
wherein the organic EL layer, the first electrode layer and the second electrode layer are sealed by the sealing member and the sealing plate, and a distribution characteristic of light emitted from the second electrode layer into the sealing plate has a luminance in a direction of another second angle of 20 to 50 degrees measured with respect to an axis perpendicular to the second electrode layer, the luminance in the direction of the another second angle being relatively high as compared to other luminance of the light emitted into the sealing plate from the second electrode layer.

21. The organic EL device of claim 20, wherein the filler includes solid or liquid resin, glass, oil or gel, or rare gas.

22. The organic EL device of claim 19, wherein all of the uneven portion is free from any contact from each of the substrate, the first electrode layer, the organic EL layer and the second electrode layer.

23. An organic EL device comprising:
a substrate configured to transmit light;
a first electrode layer configured to transmit light, the first electrode layer being formed on the substrate;
a plurality of emission units stacked on the first electrode layer, the plurality of emission units including a hole transfer layer, an electron transfer layer and an organic emission layer interposed between the hole transfer layer and the electron transfer layer;
a second electrode layer formed on one of the emission units disposed on a top in a stack direction of the plurality of emission units;
a charge generating layer interposed between the emission units;
a sealing member formed on the substrate; and
a sealing plate formed on the sealing member,
wherein a distribution characteristic of light emitted from the first electrode layer into the substrate and a distribution characteristic of light emitted from the second electrode layer have a luminance in a direction of a first angle of 20 to 50 degrees measured with respect to an axis perpendicular to the substrate, the luminance being relatively high as compared to other luminance of the light emitted from the first and second electrode layers, and a luminance of the light emitted from the first and second electrode layers being in a direction of a second angle of 20 to 50 degrees measured with respect to an axis perpendicular to the second electrode layer, the luminance in the direction of the second angle being relatively high as compared to other luminance of the light emitted from the first and second electrode layers,
wherein one or more of a surface of the sealing plate and a surface of the substrate include an uneven portion,
the uneven portion is patterned into a predetermined pattern structure,
in a plan view, the pattern structure is comprised of circles, the circles being spaced apart from each other at a predetermined interval so that each of the circles is free of any contact from all others of the circles, and the circles form a triangle-based pattern, and
in a cross-sectional view, the uneven portion is comprised of a triangular structure or a semi-circular structure.

24. The organic EL device of claim 23, further comprising:
a filler configured to fill a gap between the sealing member and the sealing plate, and between the plurality of emission units, the charge generating layer, the first electrode layer and the second electrode layer,
wherein the plurality of emission units, the charge generating layer, the first electrode layer and the second electrode layer are sealed by the sealing member and the sealing plate, and a distribution characteristic of light emitted from the second electrode layer into the sealing plate has a luminance in a direction of another second angle of 20 to 50 degrees measured with respect to an axis perpendicular to the second electrode layer, the luminance in the direction of the another second angle being relatively high as compared to other luminance of the light emitted into the sealing plate from the second electrode layer.

25. The organic EL device of claim 24, wherein the filler includes solid or liquid resin, glass, oil or gel, or rare gas.

26. The organic EL device of claim 23, wherein all of the uneven portion is free from any contact from each of the substrate, the first electrode layer and the second electrode layer.

27. An organic EL device comprising:
- a substrate configured to transmit light;
- a first electrode layer configured to transmit light, the first electrode layer being formed on the substrate;
- a first emission unit stacked on the first electrode layer, the first emission unit including a first hole transfer layer, a first electron transfer layer and a first organic emission layer interposed between the first hole transfer layer and the first electron transfer layer;
- a second emission unit stacked on the first emission unit, the second emission unit including a second hole transfer layer, a second electron transfer layer and a second organic emission layer interposed between the second hole transfer layer and the second electron transfer layer;
- a charge generating layer interposed between the first emission unit and the second emission unit;
- a second electrode layer, formed on the second emission unit, disposed on a top in a stack direction;
- a sealing member formed on the substrate; and
- a sealing plate formed on the sealing member,
- wherein a distribution characteristic of light emitted from the first electrode layer into the substrate and a distribution characteristic of light emitted from the second electrode layer have a luminance in a direction of a first angle of 20 to 50 degrees measured with respect to an axis perpendicular to the substrate, the luminance being relatively high as compared to other luminance of the light emitted from the first and second electrode layers, and a luminance of the light emitted from the first and second electrode layers being in a direction of a second angle of 20 to 50 degrees measured with respect to an axis perpendicular to the second electrode layer, the luminance in the direction of the second angle being relatively high as compared to other luminance of the light emitted from the first and second electrode layers,
- wherein one or more of a surface of the sealing plate and a surface of the substrate includes an uneven portion,
- the uneven portion is patterned into a predetermined pattern structure,
- in a plan view, the pattern structure is comprised of circles, the circles being spaced apart from each other at a predetermined interval so that each of the circles is free of any contact from all others of the circles, and the circles form a triangle-based pattern, and
- in a cross-sectional view, the uneven portion is comprised of a triangular structure or a semi-circular structure.

28. The organic EL device of claim 27, wherein all of the uneven portion is free from any contact from each of the substrate, the first and second emission units, the first electrode layer and the second electrode layer.

* * * * *